US012745582B2

(12) United States Patent
Fujii et al.

(10) Patent No.: US 12,745,582 B2
(45) Date of Patent: Sep. 22, 2026

(54) METHOD OF CLEANING SILICON WAFER, METHOD OF MANUFACTURING SILICON WAFER, AND SILICON WAFER

(71) Applicant: SHIN-ETSU HANDOTAI CO., LTD., Tokyo (JP)

(72) Inventors: Kota Fujii, Nishigo-mura (JP); Tatsuo Abe, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 316 days.

(21) Appl. No.: 18/278,071

(22) PCT Filed: Feb. 21, 2022

(86) PCT No.: PCT/JP2022/006823
§ 371 (c)(1),
(2) Date: Aug. 21, 2023

(87) PCT Pub. No.: WO2022/190830
PCT Pub. Date: Sep. 15, 2022

(65) Prior Publication Data

US 2024/0120192 A1 Apr. 11, 2024

(30) Foreign Application Priority Data

Mar. 9, 2021 (JP) ................................ 2021-037267
May 7, 2021 (JP) ................................ 2021-079337

(51) Int. Cl.
*H10P 70/00* (2026.01)
*H10P 90/00* (2026.01)

(52) U.S. Cl.
CPC ........... *H10P 70/15* (2026.01); *H10P 90/129* (2026.01)

(58) Field of Classification Search
CPC ......... H01L 21/02052; H01L 21/02024; H01L 21/02019; H01L 21/02016; H01L 21/02238; H01L 21/31111
(Continued)

(56) References Cited

U.S. PATENT DOCUMENTS 5,656,097 A * 8/1997 Olesen ............. H01L 21/67051 134/28
5,718,762 A 2/1998 Habuka et al.
(Continued)

FOREIGN PATENT DOCUMENTS

EP 1753015 A2 * 2/2007 ....... H01L 21/02052
JP H07-066195 A 3/1995
(Continued)

OTHER PUBLICATIONS

Jan. 20, 2025 Extended European Search Report issued in European Patent Application No. 22766793.8.
(Continued)

*Primary Examiner* — Duy Vu N Deo
(74) *Attorney, Agent, or Firm* — Oliff PLC

(57) ABSTRACT

A method of cleaning a silicon wafer in which the silicon wafer is roughened, including: forming an oxide film on the silicon wafer by SC1 cleaning, SC2 cleaning, or ozone water cleaning; cleaning the silicon wafer on which the oxide film is formed by using any one of: a diluted aqueous solution of ammonium hydroxide having an ammonium hydroxide concentration of 0.051% by mass or less; or a diluted aqueous solution containing ammonium hydroxide and hydrogen peroxide water and having an ammonium hydroxide concentration of 0.051% by mass or less and a hydrogen peroxide concentration of 0.2% by mass or less, the hydrogen peroxide concentration being four times or less the
(Continued)

ammonium hydroxide concentration, to roughen front and rear faces of the silicon wafer.

13 Claims, 8 Drawing Sheets

(58) Field of Classification Search
USPC .......................................................... 438/692
See application file for complete search history.

(56) References Cited

U.S. PATENT DOCUMENTS

| | | | |
|---|---|---|---|
| 5,800,626 A | 9/1998 | Cohen et al. | |
| 2006/0201413 A1 | 9/2006 | Nishizawa | |
| 2008/0132032 A1* | 6/2008 | Tomita | H01L 21/02024 438/455 |
| 2011/0045246 A1 | 2/2011 | Tahara et al. | |
| 2012/0129344 A1 | 5/2012 | Treichel et al. | |
| 2020/0083057 A1* | 3/2020 | Yoshimura | H01L 21/02024 |

FOREIGN PATENT DOCUMENTS

| | | | |
|---|---|---|---|
| JP | H07-240394 A | | 9/1995 |
| JP | H10-242107 A | | 9/1998 |
| JP | H11-121419 A | | 4/1999 |
| JP | 2001-044278 A | | 2/2001 |
| JP | 2002100599 A | * | 4/2002 |
| JP | 2011-082372 A | | 4/2011 |
| JP | 2012-523706 A | | 10/2012 |
| JP | 2015-191787 A | | 11/2015 |
| JP | 2019-111733 A | | 7/2019 |
| KR | 10-2011-0036010 A | | 4/2011 |

OTHER PUBLICATIONS

May 31, 2022 International Search Report issued in International Patent Application No. PCT/JP2022/006823.
Sep. 12, 2023 International Preliminary Report onPatentability issued in International Patent Application No. PCT/JP2022/006823.
Jun. 23, 2025 Office Action issued in Taiwanese Patent Application No. 111106512.
Jun. 25, 2024 Office Action issued in Japanese Patent Application No. 2021-079337.
Oct. 28, 2025 Office Action issued in Korean Patent Application No. 2023-7030301.

* cited by examiner

[FIG. 1]
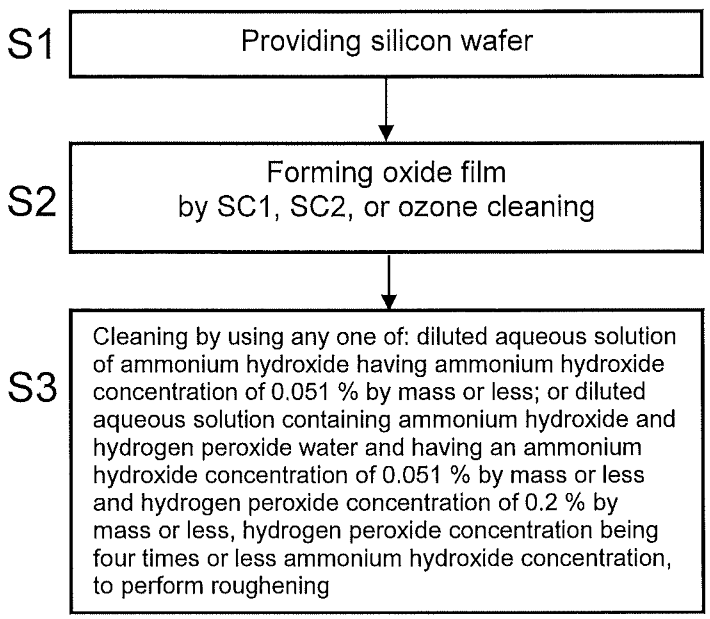
[FIG. 2]
| | | Liquid composition 1:1:10 | | Liquid composition 1:1:100 | | Liquid composition 1:1:1000 | |
|---|---|---|---|---|---|---|---|
| | | $NH_4OH$ | $H_2O_2$ | $NH_4OH$ | $H_2O_2$ | $NH_4OH$ | $H_2O_2$ |
| 80°C/10 min | wt% | 2.12 | 2.77 | 0.25 | 0.33 | 0.025 | 0.033 |
| Bare Face | SEM Image | 1μm | | 1μm | | 1μm | |
| | Haze | 20.1ppm | | 20.3ppm | | 42ppm | |
| $O_3$-oxidized film face | SEM Image | 1μm | | 1μm | | 1μm | |
| | Haze | 20ppm | | 20.4ppm | | 470ppm | |

[FIG. 3]
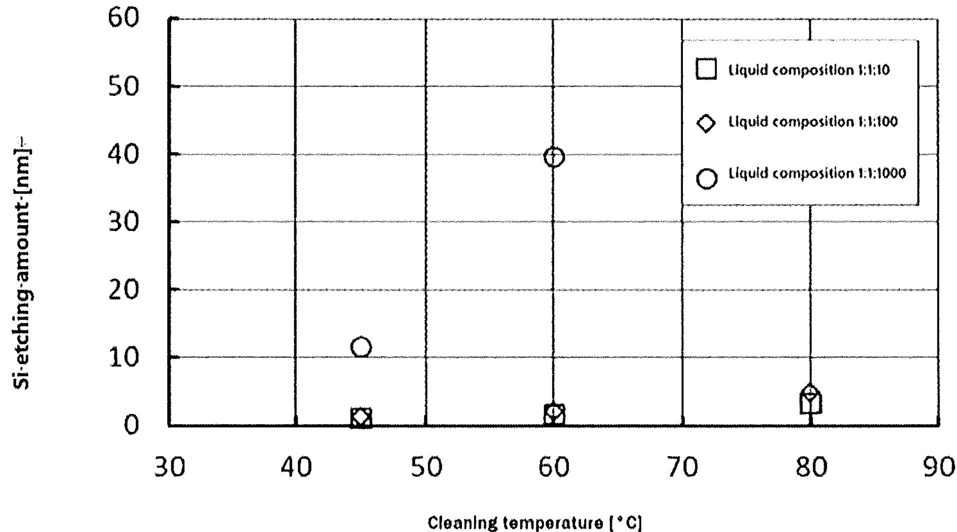
[FIG. 4]
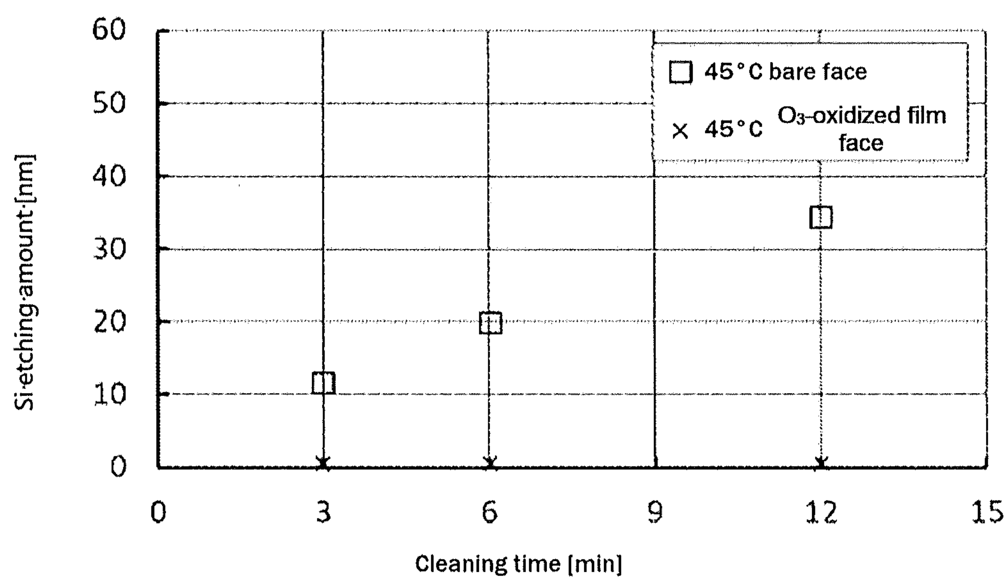

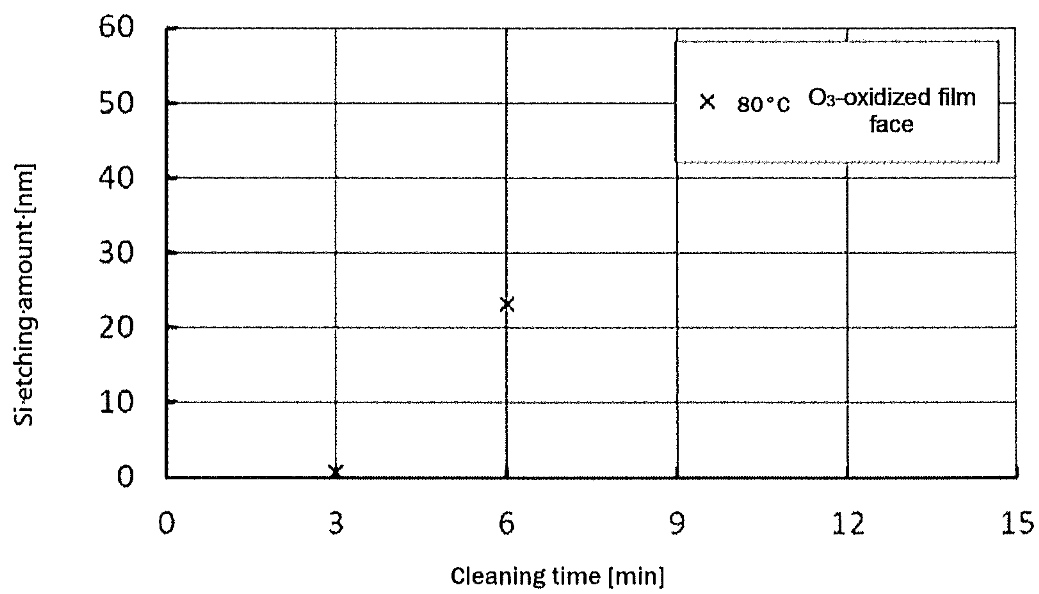
[FIG. 6]
| | | Liquid composition 1:1:1000 | | | Liquid Composition 1:2:1000 | |
|---|---|---|---|---|---|---|
| | | $NH_4OH$ | | $H_2O_2$ | $NH_4OH$ | $H_2O_2$ |
| | wt% | 0.025 | | 0.033 | 0.025 | 0.066 |
| Temperature/Time | | 70°C/4 min | 80°C/4 min | 80°C/10 min | 80°C/4 min | 80°C/10 min |
| $O_3$-oxidized film | SEM Image | 1μm | 1μm | 1μm | No change 1μm | 1μm |
| | Haze | 104nm | 1871ppm | 470nm | 31ppm | 762ppm |
| | Sa | 0.31nm | 5.5nm | 1.31nm | 0.2nm | |
| SC1-oxidized film | SEM Image | | 1μm | | 1μm | |
| | Haze | | 264ppm | | 127ppm | |
| | Sa | | 0.83nm | | 0.88nm | |

[FIG. 7]
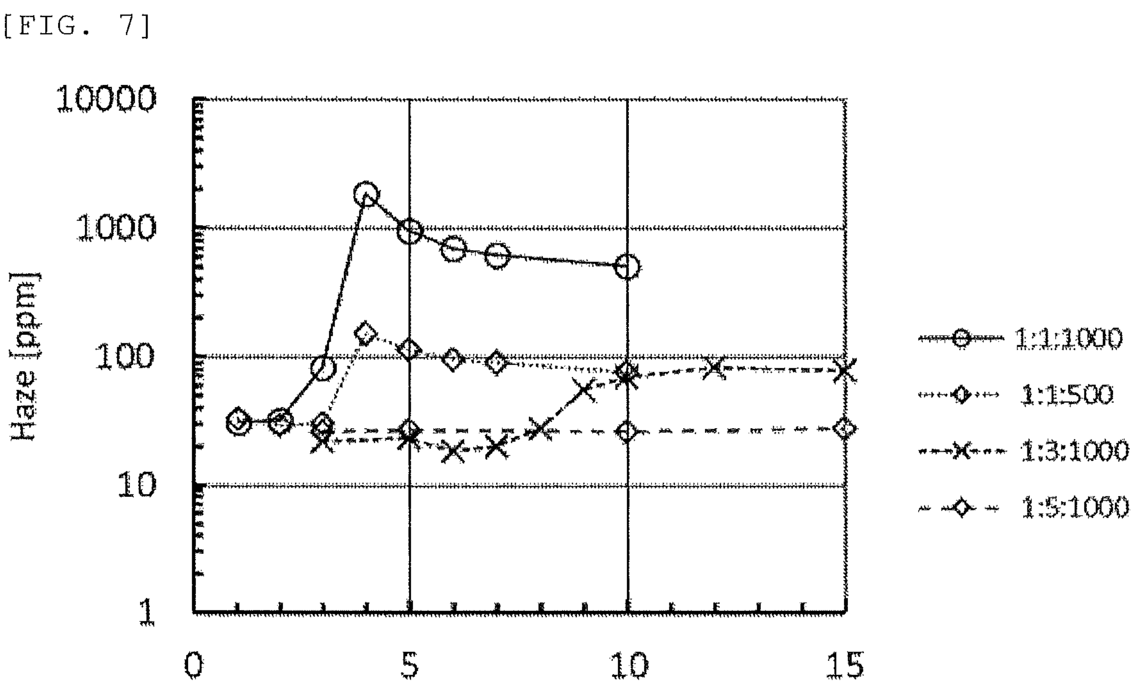
[FIG. 8]
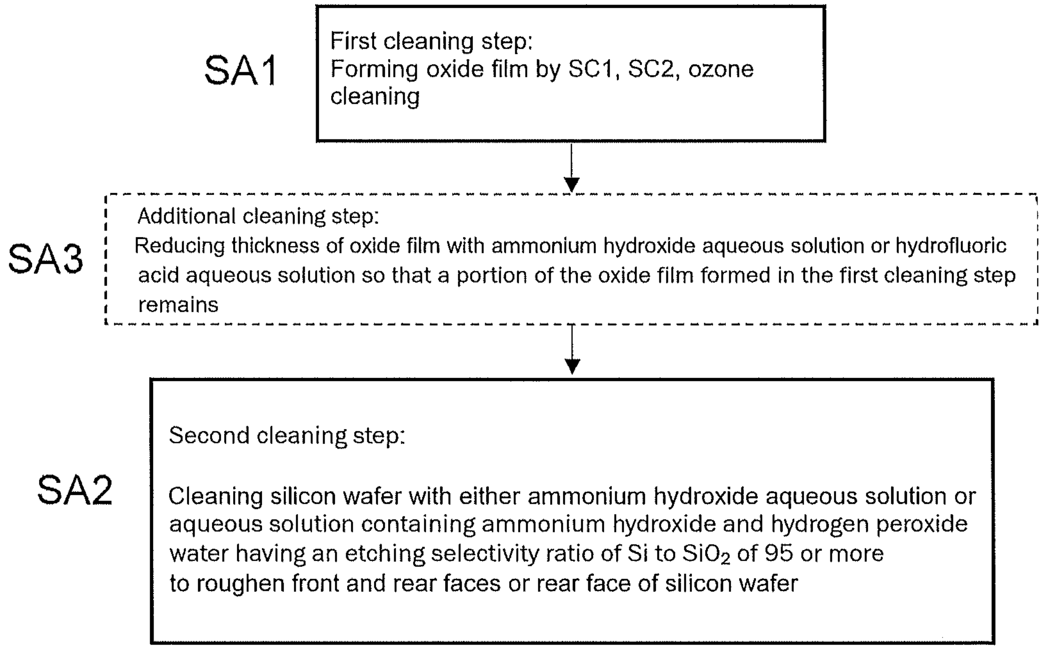

[FIG. 9]
| | Liquid composition | 1:1:10 | 1:1:100 | 1:1:1000 | 1:0.01:10 | 1:0.05:100 |
|---|---|---|---|---|---|---|
| | $NH_4OH$ wt% | 2.12 | 0.25 | 0.025 | 2.3 | 0.25 |
| | $H_2O_2$ wt% | 2.77 | 0.33 | 0.033 | 0.03 | 0.02 |
| | Temperature/Time | 80°C/10 min | 80°C/10 min | 80°C/10 min | 45°C/3 min | 60°C/3 min |
| | $Si/SIO_2$ Etching selectivity ratio | 2.5 | 6.8 | 1135 | 3607 | 1519 |
| Bare face | SEM Image | 1μm | 1μm | 1μm | 1μm | 1μm |
| | Haze | 20.1ppm | 20.3ppm | 42ppm | 47ppm | 36ppm |
| $O_3$-oxidized film face | SEM Image | 1μm | 1μm | 1μm | | |
| | Haze | 20ppm | 20.4ppm | 470ppm | 275ppm | 361ppm |
[FIG. 10]
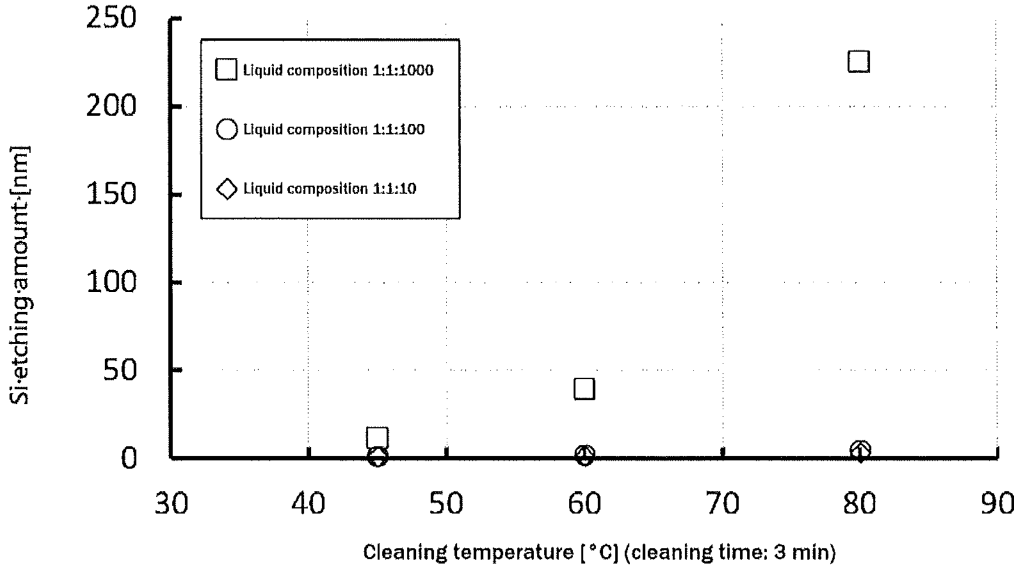

[FIG. 11]
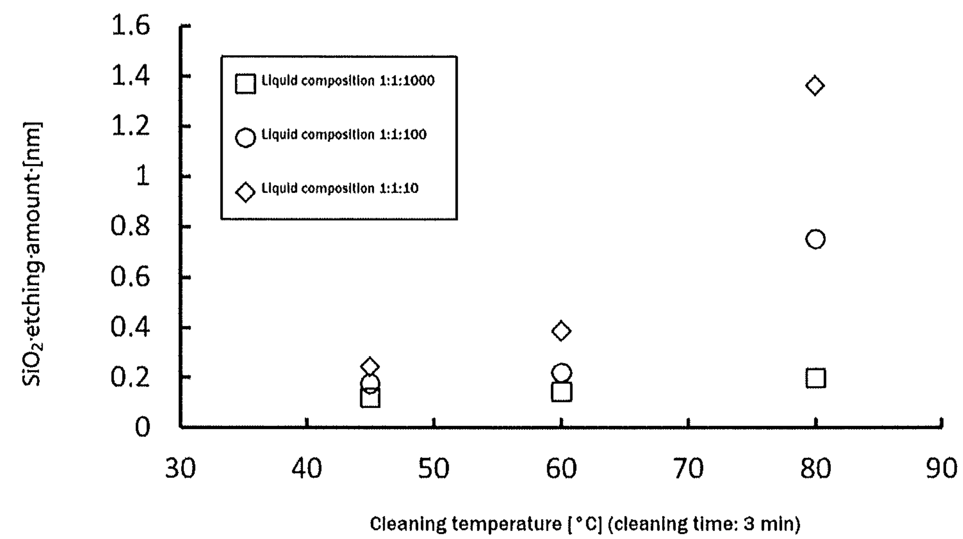
[FIG. 12]
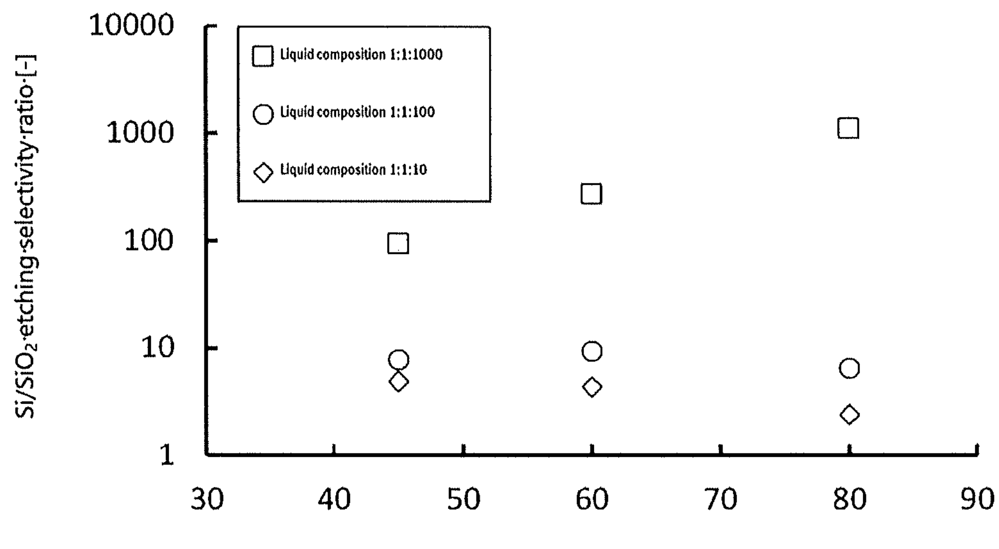

[FIG. 13]
| | Liquid Composition | 1:1:1000 | 1:1:1000 | 1:1:500 | 1:0.01:10 | 1:0.05:100 |
|---|---|---|---|---|---|---|
| | $NH_4OH$ wt% | 0.025 | 0.025 | 0.05 | 2.3 | 0.25 |
| | $H_2O_2$ wt% | 0.033 | 0.033 | 0.066 | 0.03 | 0.02 |
| | Temperature/Time | 70°C/4 min | 80°C/4 min | 80°C/4 min | 45°C/3 min | 60°C/3 min |
| | $Si/SiO_2$ Etching Selectivity Ratio | 811 | 1135 | 729 | 3607 | 1519 |
| $O_3$-oxidized film | SEM Image | 1μm | 1μm | 1μm | 1μm | 1μm |
| | Haze | 104ppm | 1871ppm | 123ppm | 203ppm | 119ppm |
| | Sa | 0.31nm | 5.5nm | 1.5nm | 0.96nm | 1.2nm |
| SC1-oxidized film | SEM Image | | 1μm | 1μm | 1μm | 1μm |
| | Haze | | 264ppm | 88ppm | 125ppm | 101ppm |
| | Sa | | 0.83nm | 0.87nm | 0.97nm | 0.86nm |
[FIG. 14]
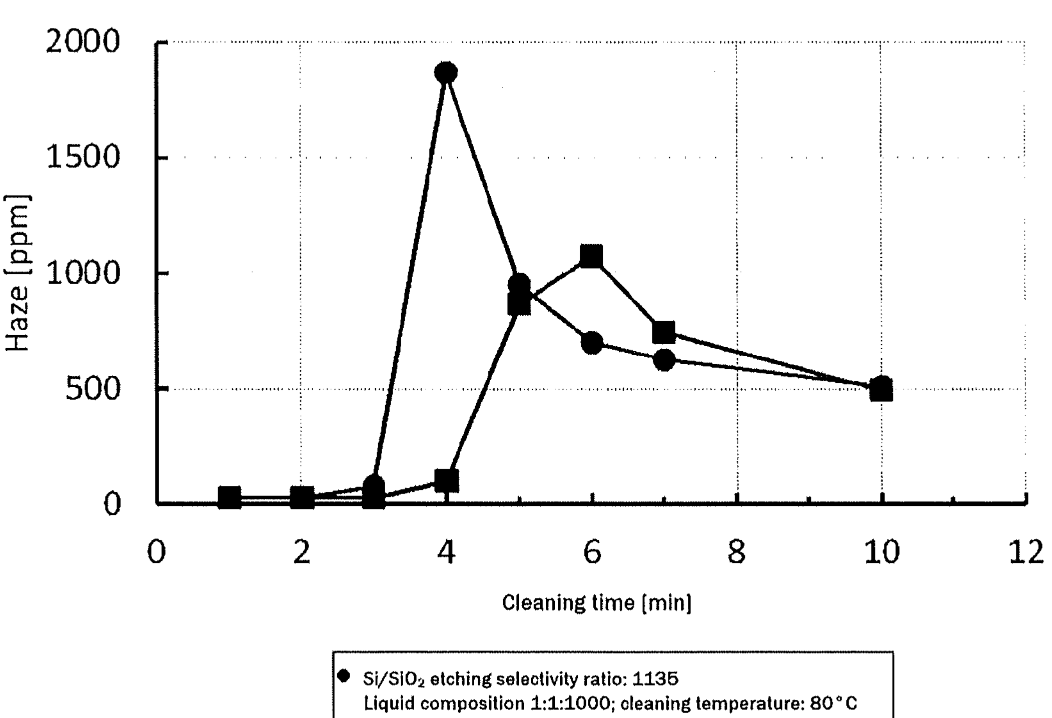

[FIG. 15]
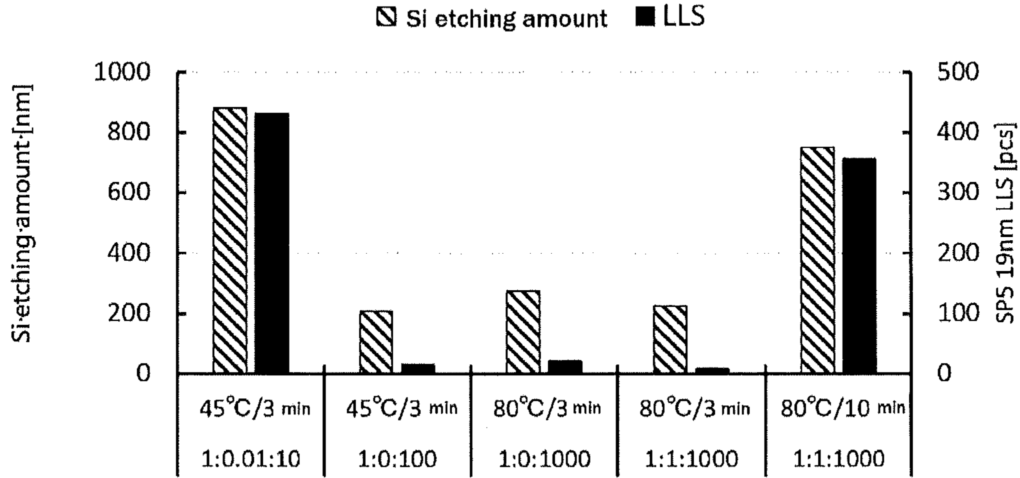
[FIG. 16]
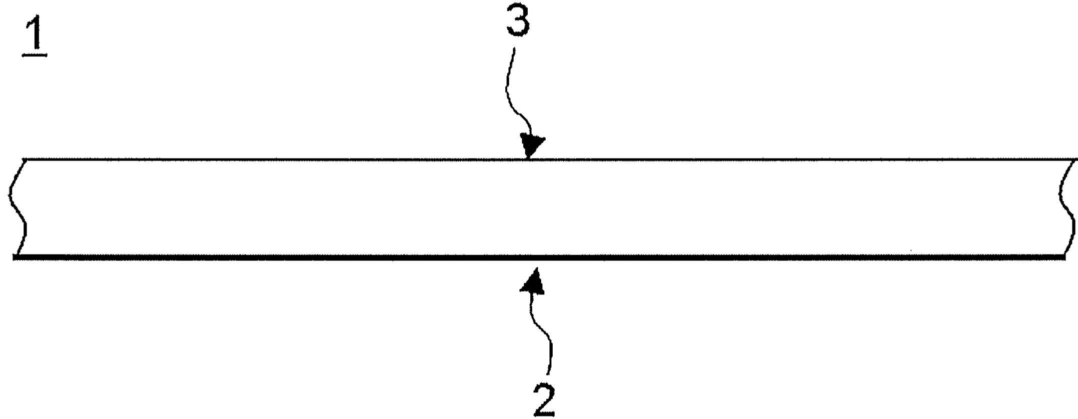

METHOD OF CLEANING SILICON WAFER, METHOD OF MANUFACTURING SILICON WAFER, AND SILICON WAFER

TECHNICAL FIELD

The present invention relates to: a method of cleaning a silicon wafer capable of roughening the front and rear faces of a silicon wafer for use in semiconductors; a method of cleaning a silicon wafer capable of roughening the front and rear faces or a rear face of a silicon wafer for use in semiconductors; a method of manufacturing a silicon wafer; and a silicon wafer.

BACKGROUND ART

The manufacture process of silicon wafers for use in semiconductor devices includes a single-crystal production step for growing single-crystal ingots using the Choklarsky (CZ) method or the like, and a wafer processing step for slicing the single-crystal ingots and mirror-finishing the resultant. Also, to add further value, such a manufacture process may include an annealing step for performing a heat treatment and an epitaxial growth step for forming an epitaxial layer.

The mirror-finishing step includes a DSP (double-side polishing) step and a subsequent CMP (single-side polishing) step. More specifically, from the viewpoint of particle quality and transportation, the DSP-processed wafers are not dried; instead, they are cleaned as necessary, and then transported to the CMP step while being stored in water. Therefore, in the CMP step, the wafers stored in water need to be chucked by a robot or other means and transported to the CMP equipment. Further, similarly, after CMP polishing, wafers that are wet with abrasives, pure water, and the like, need to be chucked and transported to the cleaning step as necessary.

Thus, in the wafer processing step, the wafers must be transported not in a dry environment but in a wet environment. However, particularly in such a wet environment, when wafers attached to the chuck are to be released, they cannot be released in some cases even if the chuck is released, thus causing a transportation failure. This is thought to be due to the roughness of the wafer surface to be chucked. If the surface roughness of the wafer to be chucked is overly high, the area in contact with the chuck will increase and the wafer will not be easily released even when the chuck is released. On the other hand, if the surface roughness of the wafer is poor, the contact area will decrease and the wafer will be easily detached. Generally, since chuck marks are likely to be formed on the chucked surface more or less, which results in a decrease in quality, the rear face of the silicon wafer is often used as the chucked face. Therefore, it is desirable that only the rear face of the silicon wafer be roughened, especially from the viewpoint of reducing transportation failure, and a method of manufacturing such a wafer has been in demand.

One of common methods of cleaning a silicon wafer is a method called RCA cleaning. This RCA cleaning is a method performed by combining SC1 (Standard Cleaning 1) cleaning, SC2 (Standard Cleaning 2) cleaning, and DHF (Diluted Hydrofluoric Acid) cleaning, according to the purpose. The SC1 cleaning is a method in which ammonia water and hydrogen peroxide water are mixed at an arbitrary ratio, and attached particles are lifted off by the etching on the silicon wafer surface with an alkaline cleaning solution, and then particles are removed while suppressing re-attachment to the silicon wafer using the electrostatic repulsion between the silicon wafer and the particles. Further, the SC2 cleaning is a cleaning method in which metallic impurities on a silicon wafer surface are dissolved and removed with a cleaning solution obtained by mixing hydrochloric acid and hydrogen peroxide water at an arbitrary ratio. Further, the DHF cleaning is a cleaning method in which a chemical oxide film on a silicon wafer surface is removed by a diluted hydrofluoric acid. In addition, in some cases, ozone water cleaning with a strong oxidizing power is used to remove organic matters adhering to the silicon wafer surface or to form a chemical oxide film on the silicon wafer surface after the DHF cleaning. The cleaning of silicon wafers is thus performed by a combination of these cleaning methods depending on the purpose. Among these methods, since the SC1 cleaning involves etching, it is generally known that the surface roughness of wafers deteriorates after the SC1 cleaning.

In addition, for a method for evaluating the surface roughness of wafers, an Sa (three-dimensional calculation average height) value obtained by an atomic force microscope (AFM) and a Haze value obtained by a particle counter can be used as indices. “Haze” is generally expressed as cloudiness and is widely used as an index of silicon surface roughness. A high Haze level indicates a rough wafer surface.

Patent Document 1 discloses a method of cleaning a silicon wafer with a diluted aqueous solution with a composition of ammonium hydroxide, hydrogen peroxide, and water ranging from 1:1:5 to 1:1:2000, thereby forming native oxide films having various thicknesses. Patent Document 2 discloses that, in the SC1 cleaning, a high concentration of OH ionized from ammonium hydroxide preferentially causes direct etching of Si, resulting in deterioration of wafer surface roughness.

CITATION LIST

Patent Literature

Patent Document 1: JP H07-66195 A
Patent Document 2: JP 2011-82372 A
Patent Document 3: JP H07-240394 A
Patent Document 4: JP H10-242107 A
Patent Document 5: JP H11-121419 A
Patent Document 6: JP 2012-523706 A

SUMMARY OF INVENTION

Technical Problem

As mentioned above, in order to reduce transportation failure during the processing steps, silicon wafers with a rough surface to be chucked are required.

The present invention was made to solve the above problems, and provides a cleaning method capable of roughening the front and rear faces of a silicon wafer, a cleaning method capable of roughening front and rear faces or a rear face of a silicon wafer, a method of manufacturing a silicon wafer capable of obtaining a silicon wafer with only one side selectively roughened, and a silicon wafer by which transportation failure during the processing steps can be reduced.

Solution to Problem

In order to solve the above problems, the present invention provides a method of cleaning a silicon wafer in which the silicon wafer is roughened, comprising:

forming an oxide film on the silicon wafer by SC1 cleaning, SC2 cleaning, or ozone water cleaning;

cleaning the silicon wafer on which the oxide film is formed by using any one of:

a diluted aqueous solution of ammonium hydroxide having an ammonium hydroxide concentration of 0.051% by mass or less, or a diluted aqueous solution containing ammonium hydroxide and hydrogen peroxide water and having an ammonium hydroxide concentration of 0.051% by mass or less and a hydrogen peroxide concentration of 0.2% by mass or less, the hydrogen peroxide concentration being four times or less the ammonium hydroxide concentration, to roughen front and rear faces of the silicon wafer.

With this method of cleaning a silicon wafer, roughening occurs during the etching of a native oxide film, and the front and rear faces of the silicon wafer can be roughened.

It is preferable that a relationship among the ammonium hydroxide concentration or the ammonium hydroxide concentration and the hydrogen peroxide concentration, cleaning temperature and cleaning time, and surface roughness after the cleaning is determined in advance for each method of forming the oxide film, and the ammonium hydroxide concentration or the ammonium hydroxide concentration and the hydrogen peroxide concentration, the cleaning temperature, and the cleaning time are selected according to the determined relationship, and the cleaning is performed.

Since the degree of roughening formed by the cleaning method of the present invention varies depending on the oxide film formation method, the ammonium hydroxide concentration or the ammonium hydroxide concentration and the hydrogen peroxide concentration, the cleaning temperature, and the cleaning time, it is effective to determine the relationship among these conditions and the degree of roughening in advance.

Further, the present invention provides a method of manufacturing a silicon wafer, comprising performing CMP polishing on one side of a silicon wafer cleaned by the method of cleaning a silicon wafer of the present invention to obtain a silicon wafer in which only a side opposite to the one side is selectively roughened.

By polishing only one side of the silicon wafer after performing roughening by the cleaning method of the present invention, it is possible to produce a wafer in which one side thereof is in a good surface condition and only the side opposite to the one side is selectively roughened.

Further, the present invention provides a silicon wafer having a roughened face with a roughness index Sa of 0.3 nm or more and 5.5 nm or less, the roughness index Sa being measured by an atomic force microscope.

With such a silicon wafer, the roughened face exhibits roughness suitable to be sucked by the chuck, thereby reducing transportation failure during the processing process.

Further, the present invention provides a silicon wafer having a roughened face with a roughness index Haze of 50 ppm or more and 1900 ppm or less, the roughness index Haze being measured by a particle counter.

With such a silicon wafer, the roughened face exhibits roughness suitable to be sucked by the chuck, thereby reducing transportation failure during the processing process.

The side opposite to the roughened face is preferably a mirror face.

Such a silicon wafer has an excellent quality.

Further, the present invention provides a method of cleaning a silicon wafer in which the silicon wafer is roughened, comprising:

a first cleaning step of forming an oxide film on the silicon wafer by SC1 cleaning, SC2 cleaning, or ozone water cleaning; and a second cleaning step of cleaning the silicon wafer on which the oxide film is formed by using any one of:

an aqueous solution containing ammonium hydroxide; or an aqueous solution containing ammonium hydroxide and hydrogen peroxide water, to roughen front and rear faces or a rear face of the silicon wafer, wherein the aqueous solution used in the second cleaning step has an etching selectivity ratio of Si to $SiO_2$ of 95 or more.

With this method of cleaning a silicon wafer, roughening occurs during the etching in the second cleaning step to etch the native oxide film formed in the first cleaning step, thus enabling manufacture of a roughened wafer.

Further, it is preferable that the etching selectivity ratio of Si to $SiO_2$ of the aqueous solution used in the second cleaning step is determined according to: (etching amount of Si/etching amount of $SiO_2$), anyone of an epitaxial wafer, a SOI wafer, and a silicon wafer with an exposed bare face without a native oxide film is used as a wafer for calculating the etching amount of Si, and a wafer with a silicon oxide film having a thickness of 3 nm or more is used as a wafer for calculating the etching amount of $SiO_2$.

With this method, etching behavior with respect to $SiO_2$ and Si can be evaluated with high accuracy.

Further, it is preferable that the etching amount of $SiO_2$ required for advancing roughening in the second cleaning step is calculated as a roughening etching amount in advance for each method of forming the oxide film in the first cleaning step, the cleaning time in the second cleaning step is selected so that the etching amount of $SiO_2$ in the second cleaning step is equal to or more than the roughening etching amount, and/or an additional cleaning step in which the thickness of the oxide film is reduced so that a portion of the oxide film formed in the first cleaning step remains is added before the second cleaning step, and cleaning time is adjusted so that the sum of the etching amount of $SiO_2$ in the additional cleaning step and the etching amount of $SiO_2$ in the second cleaning step is equal to or more than the roughening etching amount.

Since the roughening of the present invention is performed by etching a predetermined amount of $SiO_2$ during the cleaning so as to expose Si to the surface, the roughening can be more reliably advanced by calculating the etching amount of $SiO_2$ required for the roughening in advance as the roughening etching amount in this manner.

Further, it is preferable that a relationship among an etching selectivity ratio of Si to $SiO_2$ and cleaning time and a surface roughness is determined in advance for each method of forming the oxide film in the first cleaning step, and the etching selectivity ratio of Si to $SiO_2$ and the cleaning time are selected based on the determined relationship, and the second cleaning step is performed.

Since the degree of roughening formed by the cleaning method of the present invention varies depending on the etching selectivity ratio of Si to $SiO_2$, and the cleaning time, and the oxide film formation method in the first cleaning step, it is effective to determine the relationship among these conditions and the degree of roughening in advance.

Further, the present invention provides a method of manufacturing a silicon wafer, comprising performing CMP polishing on one side of a silicon wafer, which is cleaned by the method of cleaning a silicon wafer of the present invention to have roughened front and rear faces, to obtain a silicon wafer in which only a side opposite to the one side is selectively roughened.

In this manner, by polishing only the front face side after the roughening is performed on the front and rear faces, it is possible to manufacture a wafer in which the front face thereof is in a good surface condition and only the rear face is roughened.

Further, a removal allowance of the CMP polishing may be set to be equal to or greater than the etching amount of Si in the second cleaning step.

This prevents etching-induced LLS residue after the CMP, thereby maintaining a desirable LLS quality.

Further, the etching amount of Si in the second cleaning step may be set to be equal to or smaller than the removal allowance of the CMP polishing.

This prevents etching-induced LLS residue after the CMP, thereby maintaining a desirable LLS quality.

Advantageous Effects of Invention

As described above, one embodiment of the method of cleaning a silicon wafer of the present invention is capable of roughening the front and rear faces of a silicon wafer.

Further, the method of manufacturing a silicon wafer of the present invention is capable of producing a wafer in which one side thereof is in a good surface condition and only the side opposite to that one side is selectively roughened.

In addition, with the silicon wafer of the present invention, it is possible to reduce transportation failure during the processing steps.

Furthermore, another embodiment of the method of cleaning a silicon wafer of the present invention is capable of roughening the front and rear faces or a rear face of a silicon wafer.

BRIEF DESCRIPTION OF DRAWINGS

FIG. 1 is a flowchart showing an example of a first embodiment of a method of cleaning a silicon wafer of the present invention.

FIG. 2 is a diagram showing SEM images and Haze values after cleaning a bare face and an $O_3$-oxidized film face at three levels of liquid compositions: $NH_4OH:H_2O_2:H_2O$=1:1:10, 1:1:100, and 1:1:1000.

FIG. 3 is a graph showing Si etching amounts at three levels of liquid compositions: $NH_4OH:H_2O_2:H_2O$=1:1:10, 1:1:100, and 1:1:1000.

FIG. 4 is a graph showing the difference in Si etching amount on a bare face and an $O_3$-oxidized film face at the liquid composition $NH_4OH:H_2O_2:H_2O$=1:1:1000 (45° C.).

FIG. 5 is another graph showing the difference in Si etching amount on an $O_3$-oxidized film face at the liquid composition $NH_4OH:H_2O_2:H_2O$=1:1:1000 (80° C.).

FIG. 6 is a diagram showing SEM images, Haze values, and AFM Sa values after performing roughening by changing the oxide film formation method, $NH_4OH$ concentration, $H_2O_2$ concentration, cleaning temperature, and cleaning time.

FIG. 7 is a graph showing variation of Haze with respect to cleaning time when cleaning is performed by changing $NH_4OH$ concentration, $H_2O_2$ concentration, and cleaning time.

FIG. 8 is a flowchart showing an example of a second embodiment of a method of cleaning a silicon wafer of the present invention.

FIG. 9 is a diagram showing SEM images and Haze values after cleaning a bare face and an $O_3$-oxidized film face at five levels of liquid compositions: $NH_4OH:H_2O_2:H_2O$=1:1:10, 1:1:100, 1:1:1000, 1:0.01:10, and 1:0.05:100.

FIG. 10 is a graph showing Si etching amounts at three levels of liquid compositions: $NH_4OH:H_2O_2:H_2O$=1:1:10, 1:1:100, and 1:1:1000.

FIG. 11 is a graph showing $SiO_2$ etching amounts at three levels of liquid compositions: $NH_4OH:H_2O_2:H_2O$=1:1:10, 1:1:100, and 1:1:1000.

FIG. 12 is a graph showing $Si/SiO_2$ etching selectivity ratios at three levels of liquid compositions: $NH_4OH:H_2O_2:H_2O$=1:1:10, 1:1:100, and 1:1:1000.

FIG. 13 is a diagram showing SEM images, Haze values, and AFM Sa values after performing roughening by changing the type of oxide film and $Si/SiO_2$ etching selectivity ratio.

FIG. 14 is a graph showing variation of Haze with respect to cleaning time when roughening is performed by changing $Si/SiO_2$ etching selectivity ratio and cleaning time.

FIG. 15 is a graph showing Si etching amount and LLS quality after performing CMP polishing with a polishing allowance of 500 nm.

FIG. 16 is a schematic side view showing a portion of an example of a silicon wafer of the present invention.

DESCRIPTION OF EMBODIMENTS

As mentioned above, in order to reduce transportation failure during the processing steps, silicon wafers with a rough surface to be chucked have been required.

In order to achieve the above object, the present inventors have extensively studied behaviors in etching of silicon wafers using a cleaning solution including ammonium hydroxide, hydrogen peroxide water, and water from the viewpoints of the presence or absence of oxide film on the front and rear faces of silicon wafers, type of the oxide film (oxide film formation method), liquid composition (in particular, ammonium hydroxide concentration and hydrogen peroxide concentration), cleaning temperature, and cleaning time. As a result, the inventors found that, by cleaning a silicon wafer having native oxide films on the front and rear faces thereof using a diluted aqueous solution of ammonium hydroxide having an ammonium hydroxide concentration of 0.051% by mass or less, or a diluted aqueous solution containing ammonium hydroxide and hydrogen peroxide water and having an ammonium hydroxide concentration of 0.051% by mass or less and a hydrogen peroxide concentration of 0.2% by mass or less and four times or less the ammonium hydroxide concentration, the oxide films are not etched uniformly but roughened; moreover, the degree of roughening can be adjusted by controlling the type of native oxide film (oxide film formation method), liquid composition (in particular, ammonium hydroxide concentration and hydrogen peroxide concentration), cleaning temperature, and cleaning time. With these finding, the inventors completed the present invention.

Further, in order to solve the above problems, the present inventors also extensively studied behaviors in etching using a cleaning solution including ammonium hydroxide, hydrogen peroxide water, and water, in particular, the difference in etching behavior between $SiO_2$ and Si. As a result, the inventors found that, by cleaning a silicon wafer having a native oxide film on the surface using a cleaning solution having a high etching selectivity ratio of Si to $SiO_2$, etching occurs rapidly at the point where Si is exposed, resulting in roughening, and that this roughening behavior can be adjusted by controlling the aforementioned selectivity ratio. With these finding, the inventors completed another embodiment of the present invention.

That is, the present invention provides a method of cleaning a silicon wafer in which the silicon wafer is roughened, comprising:

forming an oxide film on the silicon wafer by SC1 cleaning, SC2 cleaning, or ozone water cleaning;

cleaning the silicon wafer on which the oxide film is formed by using any one of:

a diluted aqueous solution of ammonium hydroxide having an ammonium hydroxide concentration of 0.051% by mass or less, or a diluted aqueous solution containing ammonium hydroxide and hydrogen peroxide water and having an ammonium hydroxide concentration of 0.051% by mass or less and a hydrogen peroxide concentration of 0.2% by mass or less, the hydrogen peroxide concentration being four times or less the ammonium hydroxide concentration, to roughen front and rear faces of the silicon wafer.

Further, the present invention provides a method of manufacturing a silicon wafer, comprising performing CMP polishing on one side of a silicon wafer cleaned by the method of cleaning a silicon wafer of the present invention to obtain a silicon wafer in which only a side opposite to the one side is selectively roughened.

Further, the present invention is a silicon wafer having a roughened face with a roughness index Sa of 0.3 nm or more and 5.5 nm or less, the roughness index Sa being measured by an atomic force microscope.

Further, the present invention is a silicon wafer having a roughened face with a roughness index Haze of 50 ppm or more and 1900 ppm or less, the roughness index Haze being measured by a particle counter.

Further, the present invention is a method of cleaning a silicon wafer in which the silicon wafer is roughened, comprising:

a first cleaning step of forming an oxide film on the silicon wafer by SC1 cleaning, SC2 cleaning, or ozone water cleaning; and a second cleaning step of cleaning the silicon wafer on which the oxide film is formed by using any one of:

an aqueous solution containing ammonium hydroxide; or an aqueous solution containing ammonium hydroxide and hydrogen peroxide water, to roughen front and rear faces or a rear face of the silicon wafer, wherein the aqueous solution used in the second cleaning step has an etching selectivity ratio of Si to $SiO_2$ of 95 or more.

Further, the present invention is a method of manufacturing a silicon wafer, comprising performing CMP polishing on one side of a silicon wafer, which is cleaned by the method of cleaning a silicon wafer of the present invention to have roughened front and rear faces, to obtain a silicon wafer in which only a side opposite to the one side is selectively roughened.

Note that Patent Documents 1 and 2 only mention the influence of surface roughness regarding the front and rear faces of wafers. Also, although the technologies for cleaning semiconductor substrates, such as silicon wafers, are disclosed in Patent Documents 3 to 6, influences of the presence or absence of native oxide film on silicon wafers before cleaning, type of native oxide film, liquid composition, temperature, and time were not studied in detail in Patent Documents 1 to 6.

The present invention is described below in detail with reference to drawings as some examples of embodiment; however, the present invention is not limited to the examples described below.

(Method of Cleaning Silicon Wafer and Method of Manufacturing Silicon Wafer)

First Embodiment

First, the first embodiment of the method of cleaning a silicon wafer of the present invention is described below. FIG. 1 is a flowchart showing an example of the first embodiment of the method of cleaning a silicon wafer of the present invention.

As shown in S1 in FIG. 1, a silicon wafer for which front and rear faces thereof are to be roughened is provided. There are no restrictions on the conductive type or diameter of the wafer, and, for example, a wafer after DSP processing may be used.

Next, as shown in S2, an oxide film is formed on the silicon wafer by SC1 cleaning, SC2 cleaning, or ozone water cleaning. If a native oxide film is already formed on the wafer before cleaning, it is preferable that the film is removed by HF cleaning in advance, and then the cleaning described above is performed. This is because, in the present invention, the type of oxide film, i.e., the oxide film formation method, changes the etching behavior and the roughness to be formed. For example, for bare face wafers such as those after DSP processing, the oxide film formation can be performed without HF cleaning. At this time, general cleaning conditions may be employed for all of SC1, SC2, and ozone water cleaning. For example, for SC1 cleaning, the mixing ratio of ammonium hydroxide, hydrogen peroxide, and water, i.e., $NH_4OH:H_2O_2:H_2O$, may be 1:1:5 to 1:1:100, with a cleaning temperature of 60° C. or more and a cleaning time of 1 to 30 minutes. For example, for SC2 cleaning, the mixing ratio of HCl, hydrogen peroxide, and water, i.e., $HCl:H_2O_2:H_2O$, may be 1:1:5 to 1:1:20, with a cleaning temperature of 60° C. or more and a cleaning time of 1 to 30 minutes. For example, for ozone water cleaning, the ozone concentration may be 3 ppm to 25 ppm, with a cleaning temperature of room temperature and a cleaning time of 1 to 30 minutes. As described later, the roughness to be formed in the present invention varies depending on the type of the oxide film (oxide film formation method) formed in S2; therefore, an appropriate cleaning solution may be selected according to the desired roughness.

Then, as shown in S3, cleaning is performed using a diluted aqueous solution of ammonium hydroxide having an ammonium hydroxide concentration of 0.051% by mass or less, or a diluted aqueous solution containing ammonium hydroxide and hydrogen peroxide water and having an ammonium hydroxide concentration of 0.051% by mass or less and a hydrogen peroxide concentration of 0.2% by mass or less, the hydrogen peroxide concentration being four times or less the ammonium hydroxide concentration. At this time, for example, if the cleaning is performed in a batch-type cleaner with a series of chemical tanks, by performing S3 cleaning after S2 cleaning, the cleaning of the present invention can be efficiently performed in one batch.

The roughness to be formed in the present invention is described herein in detail from the viewpoints of the presence or absence of oxide film on the front and rear faces of silicon wafers, type of the oxide film (oxide film formation method), liquid composition (ammonium hydroxide concentration and hydrogen peroxide concentration), cleaning temperature, and cleaning time.

FIG. 2 shows the results of observations of front and rear faces obtained by a scanning electron microscopy (SEM) and Haze values obtained by a particle counter after cleaning the bare face and the $O_3$-oxidized film face (formed in S2) of a DSP wafer at three levels of SC1 liquid compositions: $NH_4OH:H_2O_2:H_2O$=1:1:10, 1:1:100, 1:1:1000, at 80° C./10 min. The chemical liquids used herein were ammonia water ($NH_4OH$) of 28% by mass and hydrogen peroxide water ($H_2O_2$) of 30% by mass, each of which is also expressed by % by weight (wt). "% by mass" refers to a concentration expressed as a percentage of the mass ratio of the cleaning solution and the solutes (ammonium hydroxide and hydrogen peroxide) contained therein, and is also expressed by wt %. Only at the level cleaned with a liquid composition of 1:1:1000 on the $O_3$-oxidized film face, large irregularities were observed in the SEM image; further, the Haze value was 470 ppm, which is significantly higher than the other levels, indicating roughening. Although the bare face cleaned with a liquid composition 1:1:1000 was also slightly roughened, the degree of roughening is smaller than that of the $O_3$-oxidized film face. These results indicate deposition of oxide film on the front and rear faces and also indicate that a low SC1 liquid composition causes roughening.

FIG. 3 shows the etching amounts of Si at SC1 liquid compositions: $NH_4OH:H_2O_2:H_2O$=1:1:10, 1:1:100, and 1:1:1000. There was tendency in which, the lower the liquid composition, the higher the etching amount, indicating that the lower the liquid composition, the more etching-dominant the reaction. Further, the results of the etching amounts of Si examined with a liquid composition 1:1:1000 at two levels of surface conditions, i.e., a bare face and an $O_3$-oxidized film face, are shown in FIGS. 4 and 5. It was revealed that, at 45° C., etching was advanced only on the bare face, and was advanced only slightly on the $O_3$-oxidized film face. It was also revealed that, at 80° C., the etching progress on the $O_3$-oxidized film face was small at 80° C./3 min, but etching was advanced rapidly at and after 6 minutes. Although not shown in FIG. 5, at 80° C., the etching amount on the bare face exceeded 55 nm at and after 3 minutes, and the etching amount on the $O_3$-oxidized film face also exceeded 55 nm at and after 12 minutes. This indicates that the etching behavior of Si and the etching behavior of $SiO_2$ greatly differ under the low liquid composition environment; that is, Si is easily etched and $SiO_2$ is not easily etched. Considering the results of FIG. 2 together with the etching amounts in FIGS. 4 and 5, it can be found that the roughening occurs on the $O_3$-oxidized film face with a low etching amount rather than on the bare face with a high Si etching amount, thus suggesting that the roughening is attributable to the etching behavior of the oxide film under a low liquid composition environment. The same results as those for the liquid composition 1:1:1000 were obtained at the liquid composition $NH_4OH:H_2O_2:H_2O$=1:0:1000, indicating that roughening is possible even with a diluted aqueous solution of ammonia not containing hydrogen peroxide water.

Next, FIG. 6 shows the results of the examination of the influences of the type of native oxide film (oxide film formation method), liquid composition (ammonium hydroxide concentration and hydrogen peroxide concentration), cleaning temperature, and cleaning time. The SEM images revealed that various types of roughness were formed depending on the type of oxide film, the SC1 liquid composition, the cleaning temperature, and the cleaning time at levels other than the level where wafer with an $O_3$-oxidized film was cleaned under a condition of 80° C./4 min with a liquid composition 1:2:1000. Furthermore, the Sa values obtained from AFM also varied widely from 0.31 to 5.5 nm, and similarly, the Haze values also varied from 104 to 1871 ppm. In other words, by evaluating the roughness after cleaning with respect to the oxide film formation method, the ammonium hydroxide concentration or the ammonium hydroxide concentration and the hydrogen peroxide concentration, the cleaning temperature, and the cleaning time in advance, and determining the relationship among these conditions and the roughness after cleaning, the cleaning conditions can be determined according to the desired roughness.

To obtain more specific results, the liquid compositions were investigated while fixing the temperature to 80° C. As shown in FIG. 7, the Haze value increased when the liquid compositions were 1:1:500, 1:1:1000, and 1:3:1000; however, the Haze value did not increase when using a cleaning solution with a liquid composition 1:5:1000 even after 15 minutes of cleaning, and the silicon wafer was not roughened. As revealed above, hydrogen peroxide has the effect of inhibiting the etching progress. Since the weight concentration of the liquid composition 1:3:1000 is 0.025% by mass for $NH_4OH$ and 0.099% by mass for $H_2O_2$, the weight concentration of $H_2O_2$ needs to be equal to or less than four times the weight concentration of $NH_4OH$. Since the cleaning method of the present invention is attributable to the etching action by ammonium hydroxide and the oxidizing action by hydrogen peroxide water, the method of cleaning a silicon wafer of the present invention is effective in such cases. Since the weight concentration of $NH_4OH$ at the liquid composition 1:1:500 is 0.051% by mass, $NH_4OH$ must be 0.051% by mass or less, and the liquid composition can be varied within this range.

For a diluted aqueous solution of ammonium hydroxide, the ammonium hydroxide $NH_4OH$ concentration is preferably 0.0051% by mass or more and 0.051% by mass or less. In a diluted aqueous solution containing ammonium hydroxide and hydrogen peroxide water, the ammonium hydroxide $NH_4OH$ concentration is preferably 0.0051% by mass or more and 0.051% by mass or less, and the hydrogen peroxide $H_2O_2$ concentration is preferably 0.0067% by mass or more and 0.2% by mass or less and also 0.1 times or more and four times or less the ammonium hydroxide concentration.

Next, the type of oxide film (oxide film formation method) was also investigated. A thermal oxide film with a thickness of 5 nm was prepared under a dry oxygen atmosphere using a resistance heating furnace, and cleaned under a condition at 80° C./10 min with a liquid composition 1:1:1000. However, the Haze value did not increase, and the SEM images showed no roughening. The results suggest that an oxide film formed by SC1, SC2, or ozone water cleaning is optimal in the case of roughening within the actual operational time available.

Considering the facts that the oxide film formed by cleaning generally has a thickness of about 1 nm, that a non-uniform unstable layer, which is called a structure transition layer, exists at the interface between the silicon oxide film and silicon, and that no roughening occurs in a thermal oxide film with an oxide film thickness of 5 nm, it is assumed that the roughening that occurs during the etching of the oxide film originates in the vicinity of the structure transition layer at the interface between the silicon oxide film and silicon. In the case of a thermal oxide film having a thickness of 5 nm, no roughening presumably occurred because the etching of the oxide film did not reach the vicinity of the structure transition layer at the cleaning time of 10 minutes; moreover, the thickness and film quality of the structure transition layer changed slightly also in the SC1 and ozone cleaning. It is thus presumed that the roughness varied depending on the type of the native oxide film.

Therefore, as mentioned above, it is more preferable to determine a relationship among the ammonium hydroxide concentration or the ammonium hydroxide concentration and the hydrogen peroxide concentration, the cleaning temperature and the cleaning time, and the surface roughness after the cleaning in advance for each type of oxide film (for each oxide film formation method), to select the ammonium hydroxide concentration or the ammonium hydroxide concentration and the hydrogen peroxide concentration, the cleaning temperature, and the cleaning time according to the determined relationship, and to perform the cleaning. According to the extensive study by the present inventors, for example, as shown in FIGS. 6 and 7, the roughness index Sa by AFM can be varied widely from 0.3 to 5.5 nm, and the roughness index Haze by the particle counter can be varied widely from 50 to 1871 ppm.

Finally, a certain degree of good roughness is often preferably required on the front face side of a silicon wafer, which generally serves as a device fabrication surface. For example, when the cleaning method of the present invention is performed with a batch-type cleaner, both front and rear faces are roughened; therefore, after the cleaning, single-side polishing such as CMP polishing is performed on one side of the wafer, thereby producing a wafer in which only the side opposite to that one side is selectively roughened. Such a wafer does not cause chuck failure even in a wet environment, thus enabling stable manufacture.

Second Embodiment

Next, the second embodiment of the method of cleaning a silicon wafer of the present invention is described below. FIG. 8 is a flowchart showing an example of the second embodiment of a method of cleaning a silicon wafer of the present invention.

First, a silicon wafer for which the rear face thereof is to be roughened is provided. There are no restrictions on the conductive type or diameter of the wafer, and, for example, a wafer after DSP processing may be used.

Next, as shown in SA1, an oxide film is formed on the silicon wafer by SC1 cleaning, SC2 cleaning, or ozone water cleaning (first cleaning step). If a native oxide film is already formed on the wafer before cleaning, it is preferable that the film is removed by HF cleaning in advance, and then the first cleaning step described above is performed. This is because, in the present invention, the type of oxide film, i.e., the oxide film formation method in the first cleaning step, changes the etching behavior and the roughness to be formed. For example, for bare face wafers such as those after DSP processing, the oxide film formation can be performed without HF cleaning. At this time, general cleaning conditions may be employed for all of SC1, SC2, and ozone water cleaning. The general conditions may be, for example, the conditions described in the first embodiment.

SA3 shown in FIG. 8 is an optional step that may be performed after the first cleaning step SA1 and before the second cleaning step SA2 described below. The step SA3 will be explained in a later section.

Then, as in SA2, the silicon wafer on which the oxide film is formed is cleaned with either an aqueous solution containing ammonium hydroxide or an aqueous solution containing ammonium hydroxide and hydrogen peroxide water having an etching selectivity ratio of Si to $SiO_2$ ($Si/SiO_2$ etching selectivity ratio) of 95 or more (second cleaning step).

Herein, the roughening phenomenon of the present invention is described in detail from viewpoint of the etching behavior of Si and $SiO_2$. The details of the calculation of the etching amounts of Si and $SiO_2$ are described later.

FIG. 9 shows the results of observation of front face obtained by SEM (Scanning Electron Microscopy) and Haze values obtained by a particle counter after cleaning the bare face and the $O_3$-oxidizing film face (formed in SA1 in the first cleaning step) of a DSP wafer by changing the SC1 composition (liquid composition $NH_4OH:H_2O_2:H_2O$), the cleaning temperature, and the cleaning time.

The chemical liquids used herein were ammonia water ($NH_4OH$) of 28% by mass and hydrogen peroxide water ($H_2O_2$) of 30% by mass, each of which is also expressed by % by mass (wt). "% by mass" refers to a concentration expressed as a percentage of the mass ratio of the cleaning solution and the solutes (ammonium hydroxide and hydrogen peroxide) contained therein, and is also expressed by wt %. FIG. 9 also shows an etching selectivity ratio of Si to $SiO_2$ obtained by the calculation method described later.

Only at the levels in each of which the $O_3$-oxidized film face was cleaned with aqueous solutions having liquid compositions of 1:1:1000, 1:0.01:10, or 1:0.05:100, for which the selectivity ratio is significantly high, large irregular shapes were observed in the SEM images; further, the Haze values range from 275 to 470 ppm, which are significantly higher than those in other levels, thus indicating roughening. Although the bare face was also slightly roughened by the cleaning using aqueous solutions having liquid compositions of 1:1:1000, 1:0.01:10, or 1:0.05:100, for which the selectivity ratio is significantly high, the degree of roughening was smaller than that of the $O_3$-oxidized film face. Thus, it can be seen that the roughening occurred due to the deposition of oxide film on the surface and the high $Si/SiO_2$ etching selectivity ratio of the cleaning solution used in the second cleaning step SA2. This is attributable to the fact that the oxide film formed in the first cleaning step SA1 is etched during the second cleaning step SA2 and rapid etching of Si occurred at the point where Si is locally exposed. Therefore, it is necessary to perform the cleaning by using a cleaning solution with a high $Si/SiO_2$ etching selectivity ratio, specifically, an etching selectivity ratio of 95 or more, to advance the roughening. The upper limit of the $Si/SiO_2$ etching selectivity ratio of the aqueous solution used in the second cleaning step SA2 may be, but not particularly limited to, for example, 10000.

Next, the method of calculating the $Si/SiO_2$ etching selectivity ratio, which serves as an index in the present invention, is described in detail.

The etching selectivity ratio of Si to $SiO_2$ of the aqueous solution used in the second cleaning step SA2 can be determined according to: (etching amount of Si/etching amount of $SiO_2$).

The etching amount of Si can be calculated by providing any one of an epitaxial wafer, a SOI (Silicon on Insulator) wafer, and a silicon wafer with an exposed bare face on which a native oxide film is not present, i.e., a native oxide film is not formed, cleaning the provided wafer with an aqueous solution having an arbitrary liquid composition (aqueous solution for which the $Si/SiO_2$ etching selectivity ratio is calculated), and then measuring the difference in film thickness before and after the cleaning to determine the etching amount.

For example, HF cleaning or the like is used to remove the native oxide film. If a native oxide film is present on the wafer, etching of Si does not occur until the native oxide film is etched, and the etching amount of Si cannot be accurately evaluated. The wafer for calculating the etching amount of Si needs to be a wafer without a native oxide film, because the presence of native oxide film may cause the above-mentioned roughening phenomenon to advance, which results in roughening of the wafer surface and may affect the measured values.

The wafers to be used are appropriately selected based on the etching amount. Since silicon wafers generally have a thickness of about 775 μm, if the etching amount is at least 1 μm or more, the amount of thickness change can be grasped. For example, the wafer thickness measured by a general flatness measuring apparatus or the like can be used as an index, and the wafer thicknesses before and after the cleaning can be used to find the etching amount. The measurement apparatus is not particularly limited as long as the thickness of a wafer can be measured. For example, if the etching amount is only several tens of nm, the amount of change in thickness is very small and it is difficult to grasp the amount of change. Therefore, it is not preferable to use the wafer thickness as an index.

When the etching amount is several tens to several hundreds of nm, epitaxial wafers with an epitaxial layer thickness of several μm or SOI wafers in which the Si layer thickness on the surface side of the $Si/SiO_2/Si$ structure is several tens to several hundreds of nm may be used. These wafers may be selected according to the required etching amount. As for the film thickness measurement, for example, in the case of epitaxial wafers, the difference in film thickness can be calculated by measuring the thickness of the epitaxial layer after the cleaning by way of spreading resistance analysis, utilizing the difference in resistivity between the epitaxial layer and the substrate layer. In the case of measuring the film thickness of SOI wafers, for example, spectroscopic ellipsometry can be used. For example, when the etching amount is several nanometers, the evaluation can be accurately performed by using a SOI wafer having a Si layer of 100 nm or less. For both epitaxial wafers and SOI wafers, the evaluation method is not particularly limited as long as the thickness of the epitaxial layer or the Si layer can be evaluated.

Next, as a wafer for calculating the etching amount of $SiO_2$, it is desirable to provide a wafer on which a silicon oxide film of 3 nm or more is present.

Generally, when a silicon wafer on which a native oxide film is present is subjected to SC1 cleaning in which etching of the oxide film competes with the oxidation reaction of silicon, as the silicon oxide film is etched and becomes thinner, the oxidation species easily diffuses through the silicon oxide film, thus advancing the oxidation reaction of silicon. Accordingly, the thickness of the native oxide film is constant regardless of the cleaning time. In this case, even if the film thickness difference before and after the cleaning is calculated, the etching amount of $SiO_2$ cannot be accurately determined due to the presence of the silicon oxide film formed by the oxidation reaction of silicon. Furthermore, the thickness of a native oxide film is generally about 1 nm, and it is difficult to accurately measure such a 1 nm change.

Therefore, for example, by preparing a silicon oxide film of 3 nm or more by thermal oxidation and measuring the thickness of the oxide film before and after the cleaning, the etching amount of $SiO_2$ can be accurately calculated. With a film thickness of 3 nm or more, the oxidation species cannot diffuse through the oxide film and oxidation of silicon does not occur. Accordingly, only the etching of $SiO_2$ is advanced, and the etching amount of $SiO_2$ can be accurately calculated. In addition, the film thickness can be accurately measured.

The thickness of the silicon oxide film can be selected appropriately based on the etching amount. The provided wafer with a silicon oxide film is cleaned with an aqueous solution for which the $Si/SiO_2$ etching selectivity ratio is to be calculated, and the difference in film thickness before and after the cleaning can be calculated. Examples of measurement method include spectroscopic ellipsometry.

After determining the etching amount of Si and the etching amount of $SiO_2$ at the same liquid composition and the same cleaning temperature, the etching selectivity ratio of Si to $SiO_2$ can be determined according to: (etching amount of Si/etching amount of $SiO_2$). It is also possible to calculate etching rate per unit time and then calculate etching selectivity ratio of Si to $SiO_2$ according to: (etching rate of Si/etching rate of $SiO_2$).

When this index is equal to or more than a certain value, only Si is preferentially etched at a portion where $SiO_2$ is etched and Si is exposed, thereby advancing the roughening. Since the etching behaviors of Si and $SiO_2$ change depending on the cleaning temperature, it is possible to securely perform the roughening under various conditions by determining the $Si/SiO_2$ selectivity ratio for each composition and cleaning temperature. The investigation by the present inventors revealed that roughening was advanced when a cleaning solution with the aforementioned selectivity ratio of 95 (e.g., liquid composition=1:1:1000, cleaning condition=45° C.) was used. Therefore, the $Si/SiO_2$ etching selectivity ratio must be 95 or more.

FIGS. 10 to 12 show each of the etching amounts of Si and the etching amounts of $SiO_2$ and the calculated $Si/SiO_2$ etching selectivity ratio when the cleaning is performed for 3 minutes at three levels of liquid composition and three levels of cleaning temperature. FIGS. 10 to 12 revealed that the etching amount of Si is highest in the aqueous solution with the liquid composition 1:1:1000, and that, conversely, the etching amount of $SiO_2$ is lowest in the aqueous solution with the liquid composition 1:1:1000. The results thus showed that the $Si/SiO_2$ etching selectivity ratio is high in the aqueous solution with the liquid composition 1:1:1000.

Next, the etching amount of $SiO_2$ required to advance the roughening is described below in detail. As mentioned above, the roughening of the present invention is advanced as the native oxide film is etched during the cleaning, thereby causing rapid etching of Si at a location where Si is exposed. In other words, when the cleaning is performed with a cleaning solution having a selectivity ratio of 95 or more, the roughening can be facilitated by etching $SiO_2$ in an amount necessary to expose Si. Therefore, the etching amount of $SiO_2$ required for the roughening in the second cleaning step SA2 is determined for each oxide film formation method in the first cleaning step SA1 as the roughening etching amount, and the cleaning time in the second cleaning step SA2 is selected so that the etching amount of $SiO_2$ in the second cleaning step SA2 is equal to or more than the aforementioned roughening etching amount. This enables more reliable roughening and easy selection of cleaning conditions for the second cleaning step SA2.

It is known that the etching behavior of oxide films depends on the quality of the oxide film, and that, the denser the film structure, the less likely it is to be etched. Table 1 below shows the results of cleaning of an oxide film formed by SC1 cleaning or ozone cleaning in the first cleaning step SA1 with a cleaning solution having a high $Si/SiO_2$ etching selectivity ratio (95 or more).

TABLE 1

| | 1st Tank (1st Cleaning Step) | | 2nd Tank (2nd Cleaning Step) | | | | | |
|---|---|---|---|---|---|---|---|---|
| Level | Chemical Liquid | Temperature/ Time | Chemical Liquid | Temperature/ Time | $SiO_2$ Etching Amount Unit: nm | $Si/SiO_2$ Etching Selectivity Ratio | Haze after Cleaning Unit: ppm | Roughening Determination |
| 1 | SC1 1:1:10 | 45° C./ 3 min | SC1 1:1:1000 | 45° C./ 3 min | 0.12 | 95 | 19 | No Change |
| 2 | SC1 1:1:10 | 45° C./ 3 min | SC1 1:1:1000 | 60° C./ 3 min | 0.14 | 274 | 320 | Roughened |
| 3 | Ozone 25 ppm | 25° C./ 3 min | SC1 1:1:1000 | 45° C./ 3 min | 0.12 | 95 | 21 | No Change |
| 4 | Ozone 25 ppm | 25° C./ 3 min | SC1 1:1:1000 | 60° C./ 3 min | 0.14 | 274 | 24 | No Change |
| 5 | Ozone 25 ppm | 25° C./ 3 min | SC1 1:0.05:100 | 45° C./ 3 min | 0.18 | 1313 | 22 | No Change |
| 6 | Ozone 25 ppm | 25° C./ 3 min | SC1 1:1:1000 | 80° C./ 3 min | 0.2 | 1130 | 175 | Roughened |
| 7 | Ozone 25 ppm | 25° C./ 3 min | SC1 1:0.01:10 | 45° C./ 3 min | 0.24 | 3607 | 283 | Roughened |
| 8 | Ozone 25 ppm | 25° C./ 3 min | SC1 1:1:1000 | 60° C./ 6 min | 0.24 | 274 | 198 | Roughened |

When the oxide film was formed by SC1 cleaning in the first cleaning step SA1 in the first tank (levels 1 and 2), the roughening was advanced when the etching amount of $SiO_2$ in the second cleaning step SA2 in the second tank was 0.14 nm or more. However, when the oxide film was formed by ozone cleaning in the first cleaning step SA1 in the first tank (levels 3 to 8), the roughening was advanced when the etching amount of $SiO_2$ was 0.2 nm or more in the second cleaning step SA2 in the second tank. Thus, by calculating the etching amount of $SiO_2$ required for roughening as the roughening etching amount for each of the aforementioned oxide film formation methods employed in the first cleaning step SA1, the roughening can be reliably advanced. It is known that the thickness of the native oxide film is usually 1 nm. The reason why the etching amount used as an index is smaller than 1 nm is that in the present invention, the etching amount of $SiO_2$ is determined by using a thermal oxide film that is very dense and difficult to be etched. By using the etching amount of the thermal oxide film as an index, even when the type of the oxide film differs for each of the oxide film formation methods in the first cleaning step SA1, the etching amount required for the roughening can be grasped in advance as the roughening etching amount; therefore, it is not necessary to calculate the etching amount for each type of oxide film, thereby enabling quick selection of cleaning conditions.

Further, in the cleaning method in this embodiment, as shown in FIG. 8, an additional cleaning step SA3 in which the thickness of the oxide film is reduced so that a portion of the oxide film formed in the first cleaning step SA1 remains may be added before the cleaning step of the second cleaning step SA2, and the cleaning time may be adjusted so that the sum of the etching amount of $SiO_2$ in the additional cleaning step and the etching amount of $SiO_2$ in the second cleaning step is equal to or more than the roughening etching amount.

Table 2 below shows the results of determination of the Haze value and the degree of roughening of wafers which have been subjected to the oxide film formation in the first cleaning step SA1 in the first tank, to the reduction of the thickness of the oxide film in the additional cleaning step SA3 in the second tank, and then the cleaning with a cleaning solution having $Si/SiO_2$ etching selectivity ratio of 95 in the second cleaning step SA2 in the third tank.

| | 1st Tank (1st Cleaning Step) | | 2nd Tank (Additional Cleaning Step) | | | 3rd Tank (2nd Cleaning Step) | | | | | |
|---|---|---|---|---|---|---|---|---|---|---|---|
| Level | Chemical Liquid | Temperature/ Time | Chem ical Liquid | Temperature/ Time | $SiO_2$ Etching Amount Unit: nm | Chemical Liquid | Temperature/ Time | $SiO_2$ Etching Amount Unit: nm | Total $SiO_2$ Etching Amount Unit: nm | Haze after Cleaning Unit: ppm | Roughening Determination |
| 1 | SC1 1:1:10 | 45° C./ 3 min | skip | skip | skip | SC1 1:1:1000 | 45° C./ 3 min | 0.12 | 0.12 | 18 | No Change |
| 2 | SC1 1:1:10 | 45° C./ 3 min | SC1 1:0:100 | 45 ° C./ 1 min | 0.06 | SC1 1:1:1000 | 45° C./ 3 min | 0.12 | 0.18 | 311 | Roughened |
| 3 | Ozone 25 ppm | 45° C./ 3 min | skip | skip | skip | SC1 1:1:1000 | 45° C./ 3 min | 0.12 | 0.12 | 25 | No Change |

-continued

| Level | 1st Tank (1st Cleaning Step) Chemical Liquid | 1st Tank Temperature/ Time | 2nd Tank (Additional Cleaning Step) Chemical Liquid | 2nd Tank Temperature/ Time | 2nd Tank $SiO_2$ Etching Amount Unit: nm | 3rd Tank (2nd Cleaning Step) Chemical Liquid | 3rd Tank Temperature/ Time | 3rd Tank $SiO_2$ Etching Amount Unit: nm | Total $SiO_2$ Etching Amount Unit: nm | Haze after Cleaning Unit: ppm | Roughening Determination |
|---|---|---|---|---|---|---|---|---|---|---|---|
| 4 | Ozone 25 ppm | 45° C./ 3 min | SC1 1:0:100 | 45 ° C./ 1 min | 0.06 | SC1 1:1:1000 | 45° C./ 3 min | 0.12 | 0.18 | 22 | No Change |
| 5 | Ozone 25 ppm | 45° C./ 3 min | SC1 1:0:100 | 45 ° C./ 2 min | 0.12 | SC1 1:1:1000 | 45° C./ 3 min | 0.12 | 0.24 | 178 | Roughened |

In levels 2, 4, and 5, after the first cleaning step SA1 in the first tank is performed, SC1 cleaning was performed as the additional cleaning step SA3 in the second tank, followed by the second cleaning step SA2 in the third tank. On the other hand, in levels 1 and 3, the additional cleaning step SA3 was not performed.

Even when the oxide film formed by the SC1 cleaning in the first cleaning step SA1 was cleaned for 3 minutes with a cleaning solution (liquid composition 1:1:1000, 45° C.) having a $Si/SiO_2$ etching selectivity ratio of 95, roughening was not advanced because the etching amount of $SiO_2$ was 0.12 nm, which was not more than the index of progress of roughening, i.e., 0.14 nm (level 1). On the other hand, when the same cleaning as level 1 was performed after 1 minute of additional cleaning with an aqueous solution containing ammonium hydroxide having a liquid composition of 1:0:100 in the additional cleaning step SA3 before the second cleaning step SA2, the roughening was advanced. Since the amount of etching in this additional cleaning step was 0.06 nm, the total etching amount of $SiO_2$ was assumed to be 0.06 nm+0.12 nm=0.18 nm, which falls within a range equal to or more than the index value of 0.14 nm. This is presumably why the roughening was advanced. Also for the ozone-oxidized films in levels 3 to 5, the roughening was advanced only at level 5, where the index was 0.2 nm or more. Thus, the additional cleaning step SA3 may be added before the second cleaning step SA2 so as to facilitate the progress of roughening.

Thus, the etching amount of $SiO_2$ may be adjusted by the cleaning temperature, the cleaning time, and the liquid composition in the second cleaning step SA2; alternatively, the etching amount of $SiO_2$ may be adjusted by the additional cleaning step SA3. The chemical liquid to be used for the additional cleaning step SA3 is not particularly limited insofar as it is a cleaning solution capable of reducing the thickness of a silicon oxide film, and examples thereof include an aqueous solution containing ammonium hydroxide, hydrofluoric acid, and the like.

FIG. 13 shows the results of investigation of the influences of the method of forming native oxide film (type of native oxide film) and the $Si/SiO_2$ etching selectivity ratio. A comparison between respective SEM images revealed that various types of roughness are formed depending on the type of the native oxide film, the $Si/SiO_2$ etching selectivity ratio, and the cleaning time. The Haze values obtained by the SP3 particle counter (manufactured by KLA) vary from 88 to 1871 ppm, and the Sa values obtained by the AFM vary from 0.31 to 5.5 nm. In other words, by previously evaluating the oxide film formation method (the type of oxide film) employed in the first cleaning step and the roughening (surface roughness) after the second cleaning step relative to the $Si/SiO_2$ etching selectivity ratio, and determining the relationship between these conditions and the surface roughness after the second cleaning step, the cleaning conditions can be determined according to the desired roughness. For example, it is preferable to determine the relationship among the etching selectivity ratio of Si to $SiO_2$ and the cleaning time, and the surface roughness, for each of the oxide film formation methods in the first cleaning step SA1, select the etching selectivity ratio of Si to $SiO_2$ and the cleaning time based on the determined relationship, and perform the second cleaning step SA2. The reason why the relative increases/decreases between the Haze value and the Sa are not consistent is attributable to their detection methods; thus, the necessary indices may be separately used as appropriate. As for the influence of cleaning time, as shown in FIG. 14, the Haze value significantly changes depending on the cleaning time at two levels with different $Si/SiO_2$ etching selectivity ratios. This shows easiness of adjustment of the cleaning time to enable formation of desired roughness. As shown above, the roughening method of the present invention is useful because it is capable of flexibly changing the roughness to be formed by adjusting the type of oxide film formed in the first cleaning step (the oxide film formation method in the first cleaning step), the $Si/SiO_2$ etching selectivity ratio, and the cleaning time.

Next, a cleaning method used to perform the cleaning of the present invention is described below. The majority of existing wafer cleaning methods is performed by using liquids, such as chemical liquids or pure water, and is called wet cleaning. The two major methods among them are the batch method, which cleans many wafers at once, and the single-wafer method, which processes wafers one at a time. In the batch method, both the front and rear faces of the wafer are immersed in a chemical liquid due to the equipment configuration. Therefore, when the cleaning of the present invention is performed by this method, both the front and rear faces are roughened. In contrast, in the single-wafer method, since chemical liquids are sprayed while rotating the wafer, only one side of the wafer can be cleaned. The investigation by the present inventors discovered that the roughening in the present invention may be performed both by the batch method and the single-wafer method by performing the second cleaning step at a $SiO_2$ etching amount equal to or more than a predetermined value by using an aqueous solution and a $Si/SiO_2$ etching selectivity ratio of 95 or more. It was found that a suitable method can be selected in consideration of the wafer manufacturing process.

To produce a wafer in which only the rear face thereof is roughened as described above, only the rear face may be cleaned in the single-wafer method; however, since both the front and rear faces are roughened in the batch method, it is desirable to improve the quality of the front face side by performing a polishing step, which is described later.

For example, the silicon wafer cleaning method of the present invention may be performed by using a batch-type cleaner to roughen both the front and rear faces of the silicon wafer, and then single-sided polishing such as CMP polishing may be performed on one side (i.e., the front face) to produce a wafer in which only the side (i.e., the rear face) opposite to that one side is selectively roughened.

Then, the polishing process that can be performed after the method of cleaning a silicon wafer of the present invention is described below in detail. The CMP polishing was performed on a wafer, which had been roughened by using a cleaning solution with a $Si/SiO_2$ etching selectivity ratio of 95 or more, to aim for a polishing allowance of 500 nm, and the LLS number larger than 19 nm was evaluated by the SP5 particle counter (manufactured by KLA) at 19 nm UP. As a result, as shown in FIG. 15, the LLS number increased at the levels where the etching amount of Si was large. This is because the etching amount was overly large, thus failing to remove the etching-induced defects due to the polishing. In contrast, the LLS number was very small and desirable at the levels where the etching amount of Si was small. Therefore, the LLS quality after the CMP can be estimated by using the etching amount of Si as an index. Further, also for the levels in which the LLS number increased, the LLS quality can be improved by increasing the CMP removal allowance, and the CMP polishing allowance is preferably selected based on the etching amount of Si. As described above, since the roughening occurs after $SiO_2$ is etched to expose Si, for example, if the cleaning time in the second cleaning step SA2 is 3 minutes and the time taken to advance the roughening is estimated to be 2 minutes, the removal allowance can be adjusted so that the etching amount of Si is equal to or greater than that equivalent to 1 minute of cleaning time. This allows for setting a minimum required removal allowance. If the polishing allowance is intended to be reduced from the viewpoint of manufacturing throughput, the second cleaning step SA2 may be performed under conditions where the etching amount of Si is low. Whether to control the etching amount or the polishing allowance may be selected as appropriate. By performing the polishing under these conditions, it is possible to produce a wafer with desirable surface LLS quality in which only the rear face thereof is selectively roughened, even when the front and rear faces were roughened by the batch method. Such a wafer does not cause chuck failure even in a wet environment, thus enabling stable manufacture.

(Silicon Wafer)

FIG. 16 is a schematic side view showing a portion of an example of a silicon wafer of the present invention.

The silicon wafer 1 shown in FIG. 16 has a roughened face 2. The roughness index Sa of the roughened face 2 measured by an atomic force microscope is 0.3 nm or more and 5.5 nm or less. Further, the roughness index Haze of the roughened face 2 measured by a particle counter is 50 ppm or more and 1900 ppm or less.

With such a silicon wafer 1, the roughened face 2 exhibits roughness suitable for suction by the chuck, thereby reducing transportation failure during the processing process.

The silicon wafer 1 having such a roughened face 2 can be obtained by roughening the front and rear faces of the silicon wafer by the method of cleaning a silicon wafer of the present invention.

The silicon wafer 1 shown in FIG. 16 has a mirror face 3 as the opposite side of the roughened face 2. Such a mirror face 3 can be obtained by performing single-side polishing, such as the CMP polishing, on one side of a silicon wafer that has been cleaned by the method of cleaning a silicon wafer of the present invention.

The silicon wafer 1 shown in FIG. 16 has a mirror face 3 in addition to the roughened face 2 and can therefore has excellent quality.

EXAMPLES

The present invention is specifically described below with reference to Examples and Comparative Examples. However, the present invention is not limited to these Examples.

Examples 1 to 8

Silicon wafers with bare faces obtained after DSP processing were provided, and the following cleaning was performed in a batch-type cleaner. The chemical liquids used for the SC1 cleaning were ammonia water ($NH_4OH$) of 28% by mass and hydrogen peroxide water ($H_2O_2$) of 30% by mass. The first tank was used for ozone water cleaning (25 ppm, 25° C./3 min) or SC1 cleaning ($NH_4OH:H_2O_2:H_2O$=1:1:10, 60° C./3 min) aiming at oxide film formation, and the second tank was used for SC1 cleaning while varying the liquid composition, the temperature, and the time, aiming at roughening formation. Table 3 shows more specific conditions. Thereafter, Haze evaluation was performed by using a SP3 particle counter (manufactured by KLA). Since the Haze value of non-roughened wafers were 20 to 30 ppm, wafers with a Haze value of 50 ppm or more were determined as roughened wafers. Table 3 below shows the results. As stated in Claim 1, the present invention is aimed at roughening silicon wafers; therefore, the examples thereof should originally be those in which roughening is achieved at the end. However, the levels at which roughening eventually failed are also shown in the columns of "Example" in Table 3 below for the purpose of reference.

Comparative Example 1

The wafers were cleaned in the same manner as in Example 2, except that SC1 cleaning was performed in the second tank with the liquid composition $NH_4OH:H_2O_2:H_2O$=1:5:1000. Table 3 below shows the results.

TABLE 3

| | 1st Tank | | 2nd Tank | | Roughening Evaluation | |
|---|---|---|---|---|---|---|
| | Chemical Liquid | Temperature/ Time | Chemical Liquid | Temperature/ Time | Haze (Unit: ppm) | Determination |
| Example 1 | Ozone 20 ppm | 25° C./ 3 min | SC1 1:1:1000 | 70° C./ 1 min | 32 | No Change |
| | Ozone 20 ppm | 25° C./ 3 min | SC1 1:1:1000 | 70° C./ 2 min | 32 | No Change |
| | Ozone 20 ppm | 25° C./ 3 min | SC1 1:1:1000 | 70° C./ 3 min | 32 | No Change |
| | Ozone 20 ppm | 25° C./ 3 min | SC1 1:1:1000 | 70° C./ 4 min | 104 | Roughened |
| | Ozone 20 ppm | 25° C./ 3 min | SC1 1:1:1000 | 70° C./ 5 min | 868 | Roughened |
| | Ozone 20 ppm | 25° C./ 3 min | SC1 1:1:1000 | 70° C./ 6 min | 1074 | Roughened |
| Example 2 | Ozone 20 ppm | 25° C./ 3 min | SC1 1:1:1000 | 80° C./ 1 min | 31 | No Change |
| | Ozone 20 ppm | 25° C./ 3 min | SC1 1:1:1000 | 80° C./ 2 min | 32 | No Change |
| | Ozone 20 ppm | 25° C./ 3 min | SC1 1:1:1000 | 80° C./ 3 min | 82 | Roughened |

TABLE 3-continued

| | 1st Tank | | 2nd Tank | | Roughening Evaluation | |
|---|---|---|---|---|---|---|
| | Chemical Liquid | Temperature/ Time | Chemical Liquid | Temperature/ Time | Haze (Unit: ppm) | Determination |
| | Ozone 20 ppm | 25° C./ 3 min | SC1 1:1:1000 | 80° C./ 4 min | 1871 | Roughened |
| | Ozone 20 ppm | 25° C./ 3 min | SC1 1:1:1000 | 80° C./ 5 min | 954 | Roughened |
| | Ozone 20 ppm | 25° C./ 3 min | SC1 1:1:1000 | 80° C./ 6 min | 702 | Roughened |
| Example 3 | Ozone 20 ppm | 25° C./ 3 min | SC1 1:1:500 | 80° C./ 1 min | 33 | No Change |
| | Ozone 20 ppm | 25° C./ 3 min | SC1 1:1:500 | 80° C./ 2 min | 29 | No Change |
| | Ozone 20 ppm | 25° C./ 3 min | SC1 1:1:500 | 80° C./ 3 min | 30 | No Change |
| | Ozone 20 ppm | 25° C./ 3 min | SC1 1:1:500 | 80° C./ 4 min | 152 | Roughened |
| | Ozone 20 ppm | 25° C./ 3 min | SC1 1:1:500 | 80° C./ 5 min | 112 | Roughened |
| | Ozone 20 ppm | 25° C./ 3 min | SC1 1:1:500 | 80° C./ 6 min | 95 | Roughened |
| Example 4 | Ozone 20 ppm | 25° C./ 3 min | SC1 1:2:1000 | 80° C./ 3 min | 24 | No Change |
| | Ozone 20 ppm | 25° C./ 3 min | SC1 1:2:1000 | 80° C./ 5 min | 34 | No Change |
| | Ozone 20 ppm | 25° C./ 3 min | SC1 1:2:1000 | 80° C./ 10 min | 762 | Roughened |
| Example 5 | Ozone 20 ppm | 25° C./ 3 min | SC1 1:3:1000 | 80° C./ 3 min | 22 | No Change |
| | Ozone 20 ppm | 25° C./ 3 min | SC1 1:3:1000 | 80° C./ 5 min | 23 | No Change |
| | Ozone 20 ppm | 25° C./ 3 min | SC1 1:3:1000 | 80° C./ 10 min | 293 | Roughened |
| Comparative Example 1 | Ozone 20 ppm | 25° C./ 3 min | SC1 1:5:1000 | 80° C./ 3 min | 26 | No Change |
| | Ozone 20 ppm | 25° C./ 3 min | SC1 1:5:1000 | 80° C./ 5 min | 27 | No Change |
| | Ozone 20 ppm | 25° C./ 3 min | SC1 1:5:1000 | 80° C./ 10 min | 26 | No Change |
| Example 6 | SC1 1:1:10 | 60° C./ 1.5 min | SC1 1:2:1000 | 80° C./ 1.5 min | 155 | Roughened |
| | SC1 1:1:10 | 60° C./ 3 min | SC1 1:2:1000 | 80° C./ 3 min | 127 | Roughened |
| | SC1 1:1:10 | 60° C./ 3 min | SC1 1:2:1000 | 80° C./ 6 min | 121 | Roughened |
| Example 7 | SC1 1:1:10 | 60° C./ 1.5 min | SC1 1:3:1000 | 80° C./ 1.5 min | 33 | No Change |
| | SC1 1:1:10 | 60° C./ 3 min | SC1 1:3:1000 | 80° C./ 3 min | 27 | No Change |
| | SC1 1:1:10 | 60° C./ 3 min | SC1 1:3:1000 | 80° C./ 6 min | 69 | Roughened |
| Example 8 | SC1 1:1:10 | 60° C./ 1.5 min | SC1 1:1:500 | 80° C./ 1.5 min | 92 | Roughened |
| | SC1 1:1:10 | 60° C./ 3 min | SC1 1:1:500 | 80° C./ 3 min | 103 | Roughened |
| | SC1 1:1:10 | 60° C./ 3 min | SC1 1:1:500 | 80° C./ 6 min | 101 | Roughened |

In the levels (Examples 1 to 3) in which an ozone ($O_3$)-oxidized film face was cleaned with a liquid composition $NH_4OH$:$H_2O_2$:$H_2O$=1:1:1000 ($NH_4OH$ concentration: 0.025% by mass; $H_2O_2$ concentration: 0.033% by mass) or a liquid composition $NH_4OH$:$H_2O_2$:$H_2O$=1:1:500 ($NH_4OH$ concentration: 0.051% by mass; $H_2O_2$ concentration: 0.066% by mass), when the liquid composition 1:1:1000 was used, the Haze value increased at the cleaning time of 4 minutes or more and the cleaning temperature of 70° C. (Example 1) and the Haze value increased at the cleaning time of 3 minutes or more and the cleaning temperature of 80° C. (Example 2); and, in each of these cases, the roughening was advanced. Since the etching of the oxide film was more rapidly advanced at 80° C., it is assumed that roughening was easier at 80° C. In the case of using the liquid composition 1:1:500 and the cleaning temperature of 80° C. (Example 3), the Haze value increased at the cleaning time of 4 minutes or more; and, in each of these cases, the roughening was advanced.

Subsequently, in the levels (Examples 4 and 5 and Comparative Example 1) in which an ozone ($O_3$)-oxidized film face was cleaned at the cleaning temperature of 80° C. with a liquid composition $NH_4OH$:$H_2O_2$:$H_2O$=1:2:1000 ($NH_4OH$ concentration: 0.025% by mass; $H_2O_2$ concentration: 0.066% by mass), a liquid composition $NH_4OH$:$H_2O_2$:$H_2O$=1:3:1000 ($NH_4OH$ concentration: 0.025% by mass; $H_2O_2$ concentration: 0.099% by mass) or a liquid composition $NH_4OH$:$H_2O_2$:$H_2O$=1:5:1000 ($NH_4OH$ concentration: 0.025% by mass; $H_2O_2$ concentration: 0.165% by mass), when the liquid composition was 1:2:1000 (Example 4) and 1:3:1000 (Example 5), the increase in the Haze value was observed only at 10 minutes, and no roughening occurred at 3 and 5 minutes. When the liquid composition was 1:5:1000 (Comparative Example 1), the increase in the Haze value was not observed even after 10 minutes and no roughening occurred. This is thought to be due to the fact that only the amount of hydrogen peroxide was increased, thus suppressing etching.

Next, in the levels (Examples 6 to 8) in which an SC1-oxidized film face formed by SC1 cleaning was cleaned with a liquid composition $NH_4OH$:$H_2O_2$:$H_2O$=1:2:1000 ($NH_4OH$ concentration: 0.025% by mass; $H_2O_2$ concentration: 0.066% by mass), a liquid composition $NH_4OH$:$H_2O_2$:$H_2O$=1:3:1000 ($NH_4OH$ concentration: 0.025% by mass; $H_2O_2$ concentration: 0.099% by mass) or a liquid composition $NH_4OH$:$H_2O_2$:$H_2O$=1:1:500 ($NH_4OH$ concentration: 0.051% by mass; $H_2O_2$ concentration: 0.066% by mass), in the case where the liquid composition was 1:2:1000 (Example 6) or 1:1:500 (Example 8), roughening occurred at 1.5 minutes of cleaning time, indicating that the roughening was more easily advanced compared with the ozone ($O_3$)-oxidized film face. This is thought to be due to the difference in film thickness and film quality between the ozone ($O_3$)-oxidized film and the SC1-oxidized film. If the relationship among the ammonium hydroxide concentration, the hydrogen peroxide concentration, the cleaning temperature and cleaning time, and the surface roughness thus is determined for each type of oxide film (each oxide film formation method) in advance, wafers with desired roughness can be produced by selecting cleaning conditions based on this relationship and performing cleaning. Also in Example 7, it was confirmed that the front and rear faces of the wafers were roughened at of cleaning time of 6 minutes.

After CMP processing was performed on one side of a silicon wafer, which was cleaned in the second tank at the level with a cleaning time of 1.5 minutes in Example 6, a chuck test was conducted using a CMP polishing machine. A transportation test in which a roughened side (rear face), which is opposite to the side where CMP processing was performed, of a wafer stored in water was chucked and the wafer was unchucked onto the stage of the polishing machine was repeated 200 times, with the results that the wafer was successfully transported without any defects in all of 200 tests.

Comparative Examples 2 to 6

Silicon wafers with bare faces obtained after DSP processing, which were similar to those used in the Examples, were provided, and the following cleaning was performed in a batch-type cleaner. In the first tank, oxide film formation was performed by ozone water cleaning (Comparative Examples 2 and 3) or the bare faces were left without being cleaned (Comparative Examples 4 to 6). The second tank had a liquid composition $NH_4OH:H_2O_2:H_2O$=1:1:10 ($NH_4OH$ concentration: 2.12% by mass; $H_2O_2$ concentration: 2.77% by mass) or a liquid composition $NH_4OH:H_2O_2:H_2O$=1:1:100 ($NH_4OH$ concentration: 0.25% by mass; $H_2O_2$ concentration: 0.33% by mass). In addition to these, only bare faces were also subjected to cleaning with a liquid composition $NH_4OH:H_2O_2:H_2O$=1:1:1000 ($NH_4OH$ concentration: 0.025% by mass; $H_2O_2$ concentration: 0.033% by mass). Table 4 below shows the cleaning conditions and results of Comparative Examples 2 to 6.

TABLE 4

| | 1st Tank | | 2nd Tank | | Roughening Evaluation | |
|---|---|---|---|---|---|---|
| | Chemical Liquid | Temperature Time | Chemical Liquid | Temperature/ Time | Haze (Unit: ppm) | Determination |
| Comparative Example 2 | Ozone 20 ppm | 25° C./ 3 min | SC1 1:1:10 | 80° C./ 1 min | 26 | No Change |
| | Ozone 20 ppm | 25° C./ 3 min | SC1 1:1:10 | 80° C./ 3 min | 27 | No Change |
| | Ozone 20 ppm | 25° C./ 3 min | SC1 1:1:10 | 80° C./ 10 min | 27 | No Change |
| Comparative Example 3 | Ozone 20 ppm | 25° C./ 3 min | SC1 1:1:100 | 80° C./ 1 min | 27 | No Change |
| | Ozone 20 ppm | 25° C./ 3 min | SC1 1:1:100 | 80° C./ 3 min | 28 | No Change |
| | Ozone 20 ppm | 25° C./ 3 min | SC1 1:1:100 | 80° C./ 10 min | 28 | No Change |
| Comparative Example 4 | skip (Bare Face) | skip (Bare Face) | SC1 1:1:10 | 80° C./ 1 min | 26 | No Change |
| | skip (Bare Face) | skip (Bare Face) | SC1 1:1:10 | 80° C./ 3 min | 27 | No Change |
| | Skip (Bare Face) | skip (Bare Face) | SC1 1:1:10 | 80° C./ 10 min | 27 | No Change |
| Comparative Example 5 | skip (Bare Face) | skip (Bare Face) | SC1 1:1:100 | 80° C./ 1 min | 27 | No Change |
| | skip (Bare Face) | skip (Bare Face) | SC1 1:1:100 | 80° C./ 3 min | 28 | No Change |
| | skip (Bare Face) | skip (Bare Face) | SC1 1:1:100 | 80° C./ 10 min | 29 | No Change |
| Comparative Example 6 | skip (Bare Face) | skip (Bare Face) | SC1 1:1:1000 | 80° C./ 1 min | 29 | No Change |
| | skip (Bare Face) | skip (Bare Face) | SC1 1:1:1000 | 80° C./ 3 min | 35 | No Change |
| | skip (Bare Face) | skip (Bare Face) | SC1 1:1:1000 | 80° C./ 10 min | 42 | No Change |

In all of Comparative Examples 2 to 6, there were no levels exceeding a Haze value of 50 ppm. In the second tank of Comparative Example 6 with a cleaning time of 10 minutes, a slight increase in Haze value, i.e., 42 ppm, was observed; however, since the value did not exceed 50 ppm, it was determined that the roughening did not occur.

After CMP processing was performed on one side of a silicon wafer, which was cleaned in the second tank in Comparative Example 2 at the level with a cleaning time of 10 minutes, a chuck test similar to that of Examples was conducted 200 times using a CMP polishing machine. As a result, in 4 out of 200 tests, a defect occurred in which the wafer was not released from the chuck.

Examples A1 to A12, A19 to A33

Wafers with bare faces obtained after DSP polishing were provided, and the following cleaning was performed in a batch-type cleaner. The chemical liquids used for the SC1 cleaning were ammonia water ($NH_4OH$) of 28% by mass and hydrogen peroxide water ($H_2O_2$) of 30% by mass. The first tank was used for the first cleaning step to perform ozone water cleaning (25 ppm, 25° C./3 min) or SC1 cleaning ($NH_4OH:H_2O_2:H_2O$=1:1:10, 45° C./3 min) aiming at oxide film formation, and the second tank was used for the second cleaning step to perform SC1 cleaning while varying the composition, the temperature, and the time as shown in Tables 5 and 6 below aiming at roughening formation. Thereafter, Haze evaluation was performed by using a SP3 particle counter (manufactured by KLA). Further, at the same time, for each of the aqueous solutions used in the second tank, the etching amount of Si and the etching amount of $SiO_2$ were calculated from the difference in film thickness before and after the cleaning by the method described above, and the Si/$SiO_2$ etching selectivity ratio was calculated. To calculate the etching amount of Si, a silicon wafer with an exposed bare face without a native oxide film obtained after the HF cleaning was used, and the etching amount of Si was determined from the wafer thickness before and after the wafer cleaning using a flatness measuring apparatus. To calculate the etching amount of $SiO_2$, a wafer with a 5 nm oxide film formed by thermal oxidation was used, and the etching amount of $SiO_2$ was determined from the oxide film thickness before and after the cleaning using a M-2000V spectroscopic ellipsometry (manufactured by J. A. Woolam).

Since the Haze value of the wafer before the roughening was about 20 ppm, it was determined that roughening occurred in all of Examples A1 to A12 and A19 to A33.

Examples A13 to A18 and A34

Wafers with bare faces obtained after DSP polishing were provided, and the following cleaning was performed in a batch-type cleaner. The chemical liquids used for the SC1 cleaning were ammonia water ($NH_4OH$) of 28% by mass and hydrogen peroxide water ($H_2O_2$) of 30% by mass. The first tank was used for the first cleaning step to perform ozone water cleaning (25 ppm, 25° C./3 min) or SC1 cleaning ($NH_4OH:H_2O_2:H_2O$=1:1:10, 45° C./3 min) aiming at oxide film formation, the second tank was used for the additional cleaning step to reduce the thickness of the oxide film using ammonia water having a composition of 1:0:100 or 0.05 wt % of HF by removing a part of the oxide film formed in the first tank to prevent the bare face from being exposed, and the third tank was used for the second cleaning step to perform SC1 cleaning while varying the composition, the temperature, and the time as shown in Tables 5 and 6 below aiming at roughening formation. Further, at the same time, for each of the aqueous solutions used in the third tank, the etching amount of Si and the etching amount of $SiO_2$ were calculated from the difference in film thickness before and after the cleaning by the method described above, and the Si/$SiO_2$ etching selectivity ratio was calculated. In the additional cleaning step in the second tank, the etching amount of $SiO_2$ was calculated in advance using a wafer with a 5 nm oxide film, and the cleaning conditions were adjusted so that the total etching amount of $SiO_2$ in the second and third tanks becomes 0.2 nm or more when the oxide film type in the first tank was an ozone-oxidized film, and that the total etching amount of $SiO_2$ in the second and third tanks becomes 1.4 nm or more when the oxide film type in the first tank was SC1-oxidized film. Based on the Haze value obtained by SP3 after the cleaning, it was determined that roughening occurred in all examples.

TABLE 5

| | 1st Tank | | 2nd Tank | | | | 3rd Tank | | | | Total | Roughening Evaluation | |
|---|---|---|---|---|---|---|---|---|---|---|---|---|---|
| | Chemical Liquid | Temperature/ Time | Chemical Liquid | Temperature/ Time | $Si/Si0_2$ Etching Selectivity Ratio | $Si0_2$ Etching Amount nm | Chemical Liquid | Temperature/ Time | $Si/Si0_2$ Etching Selectivity Ratio | $Si0_2$ Etching Amount nm | $Si0_2$ Etching Amount nm | Haze Unit: ppm | Determination |
| Example A1 | Ozone 25 ppm | 25° C./ 3 min | SC1 1:0.01:10 | 45° C./ 3 min | 3607 | 0.24 | | | | | 0.24 | 205 | Roughened |
| Example A2 | Ozone 25 ppm | 25° C./ 3 min | SC1 1:0.01:10 | 80° C./ 3 min | 1087 | 1.37 | | | | | 1.37 | 251 | Roughened |
| Example A3 | Ozone 25 ppm | 25° C./ 3 min | SC1 1:0.03:10 | 45° C./ 3 min | 835 | 0.24 | | | | | 0.24 | 138 | Roughened |
| Example A4 | Ozone 25 ppm | 25° C./ 3 min | SC1 1:0:100 | 80° C./ 3 min | 920 | 0.76 | | | | | 0.76 | 154 | Roughened |
| Example A5 | Ozone 25 ppm | 25° C./ 3 min | SC1 1:0.05:100 | 60° C./ 3 min | 1519 | 0.22 | | | | | 0.22 | 112 | Roughened |
| Example A6 | Ozone 25 ppm | 25° C./ 3 min | SC1 1:0.1:100 | 80° C./ 3 min | 1392 | 0.76 | | | | | 0.76 | 87 | Roughened |
| Example A7 | Ozone 25 ppm | 25° C./ 3 min | SC1 1:0:1000 | 80° C./ 3 min | 1363 | 0.20 | | | | | 0.20 | 101 | Roughened |
| Example A8 | Ozone 25 ppm | 25° C./ 3 min | SC1 1:1:1000 | 80° C./ 3 min | 1130 | 0.20 | | | | | 0.20 | 97 | Roughened |
| Example A9 | Ozone 25 ppm | 25° C./ 3 min | SC1 1:2:1000 | 80° C./ 3 min | 390 | 0.20 | | | | | 0.20 | 85 | Roughened |
| Example A10 | Ozone 25 ppm | 25° C./ 3 min | SC1 1:0:500 | 80° C./ 3 min | 1755 | 0.21 | | | | | 0.21 | 89 | Roughened |
| Example A11 | Ozone 25 ppm | 25° C./ 3 min | SC1 1:1:500 | 80° C./ 3 min | 729 | 0.21 | | | | | 0.21 | 72 | Roughened |
| Example A12 | Ozone 25 ppm | 25° C./ 3 min | SC1 1:2:500 | 80° C./ 3 min | 156 | 0.21 | | | | | 0.21 | 69 | Roughened |
| Example A13 | Ozone 25 ppm | 25° C./ 3 min | SC1 1:0:100 | 45° C./ 1 min | | 0.06 | SC1 1:0:100 | 45° C./ 3 min | 1175 | 0.18 | 0.24 | 88 | Roughened |
| Example A14 | Ozone 25 ppm | 25° C./ 3 min | SC1 1:0:100 | 45° C./ 1 min | | 0.06 | SC1 1:0.05:100 | 45° C./ 3 min | 1313 | 0.18 | 0.24 | 65 | Roughened |
| Example A15 | Ozone 25 ppm | 25° C./ 3 min | SC1 1:0:100 | 45° C./ 2 min | | 0.12 | SC1 1:1:1000 | 45° C./ 3 min | 95 | 0.12 | 0.24 | 230 | Roughened |
| Example A16 | Ozone 25 ppm | 25° C./ 3 min | SC1 1:0:100 | 45° C./ 2 min | | 0.06 | SC1 1:1:1000 | 60° C./ 3 min | 274 | 0.14 | 0.20 | 212 | Roughened |
| Example A17 | Ozone 25 ppm | 25° C./ 3 min | HF 0.05 wt % | 25° C./ 30 sec | | 0.05 | SC1 1:0:100 | 45° C./ 3 min | 1175 | 0.18 | 0.23 | 89 | Roughened |
| Example A18 | Ozone 25 ppm | 25° C./ 3 min | HF 0.05 wt % | 25° C./ 30 sec | | 0.05 | SC1 1:0.05:1000 | 45° C./ 3 min | 1313 | 0.18 | 0.23 | 267 | Roughened |

TABLE 6

| | 1st Tank | | 2nd Tank | | | | 3rd Tank | | | | Total | Roughening Evaluation | |
|---|---|---|---|---|---|---|---|---|---|---|---|---|---|
| | Chemical Liquid | Temperature/ Time | Chemical Liquid | Temperature/ Time | $Si/Si0_2$ Etching Selectivity Ratio | $Si0_2$ Etching Amount nm | Chemical Liquid | Temperature/ Time | $Si/Si0_2$ Etching Selectivity Ratio | $Si0_2$ Etching Amount nm | $Si0_2$ Etching Amount nm | Haze Unit: ppm | Determination |
| Example A19 | SC1 1:1:10 | 45° C./ 3 min | SC1 1:0.01:10 | 45° C./ 3 min | 3607 | 0.24 | | | | | 0.24 | 121 | Roughened |
| Example A20 | SC1 1:1:10 | 45° C./ 3 min | SC1 1:0.01:10 | 80° C./ 3 min | 1087 | 1.37 | | | | | 1.37 | 118 | Roughened |
| Example A21 | SC1 1:1:10 | 45° C./ 3 min | SC1 1:0.03:10 | 45° C./ 3 min | 835 | 1.37 | | | | | 1.37 | 98 | Roughened |
| Example A22 | SC1 1:1:10 | 45° C./ 3 min | SC1 1:0:100 | 45° C./ 3 min | 1175 | 0.18 | | | | | 0.18 | 86 | Roughened |
| Example A23 | SC1 1:1:10 | 45° C./ 3 min | SC1 1:0:100 | 80° C./ 3 min | 920 | 0.76 | | | | | 0.76 | 91 | Roughened |
| Example A24 | SC1 1:1:10 | 45° C./ 3 min | SC1 1:0. 05:100 | 45° C./ 3 min | 1313 | 0.18 | | | | | 0.18 | 77 | Roughened |
| Example A25 | SC1 1:1:10 | 45° C./ 3 min | SC1 1:0. 05:100 | 60° C./ 3 min | 1519 | 0.22 | | | | | 0.22 | 102 | Roughened |
| Example A26 | SC1 1:1:10 | 45° C./ 3 min | SC1 1:0.1:100 | 80° C./ 3 min | 1392 | 0.22 | | | | | 0.22 | 89 | Roughened |
| Example A27 | SC1 1:1:10 | 45° C./ 3 min | SC1 1:0.1:1000 | 80° C./ 3 min | 1363 | 0.20 | | | | | 0.20 | 63 | Roughened |
| Example A28 | SC1 1:1:10 | 45° C./ 3 min | SC1 1:1:1000 | 60° C./ 3 min | 274 | 0.14 | | | | | 0.14 | 75 | Roughened |
| Example A29 | SC1 1:1:10 | 45° C./ 3 min | SC1 1:1:1000 | 80° C./ 3 min | 1130 | 0.20 | | | | | 0.20 | 77 | Roughened |

TABLE 6-continued

| | 1st Tank | | 2nd Tank | | | | 3rd Tank | | | | Total | Roughening | |
|---|---|---|---|---|---|---|---|---|---|---|---|---|---|
| | Chemical Liquid | Temperature/Time | Chemical Liquid | Temperature/Time | $Si/SiO_2$ Etching Selectivity Ratio | $SiO_2$ Etching Amount nm | Chemical Liquid | Temperature/Time | $Si/SiO_2$ Etching Selectivity Ratio | $SiO_2$ Etching Amount nm | $SiO_2$ Etching Amount nm | Evaluation Haze Unit: ppm | Determination |
| Example A30 | SC1 1:1:10 | 45° C./ 3 min | SC1 1:2:1000 | 80° C./ 3 min | 390 | 0.20 | | | | | 0.20 | 98 | Roughened |
| Example A31 | SC1 1:1:10 | 45° C./ 3 min | SC1 1:0:500 | 80° C./ 3 min | 1755 | 0.21 | | | | | 0.21 | 91 | Roughened |
| Example A32 | SC1 1:1:10 | 45° C./ 3 min | SC1 1:1:500 | 80° C./ 3 min | 729 | 0.21 | | | | | 0.21 | 86 | Roughened |
| Example A33 | SC1 1:1:10 | 45° C./ 3 min | SC1 1:2:500 | 80° C./ 3 min | 156 | 0.21 | | | | | 0.21 | 65 | Roughened |
| Example A34 | Sc1 1:1:10 | 45° C./ 3 min | SC1 1:0:100 | 45° C./ 1 min | | 0.06 | SC1 1:1:1000 | 45° C./ 3 min | 95 | 0.12 | 0.18 | 371 | Roughened |

Next, since the etching amount of Si in Example A19 was 820 nm and the etching amount of Si in Example A22 was 230 nm, CMP polishing with a polishing allowance of 1000 nm was performed on the front face of the silicon wafer of Example A19, and CMP polishing with a polishing allowance of 500 nm was performed on the silicon wafer of Example A22. LLS of each wafer after the CMP processing was evaluated by SP5 (manufactured by KLA) at 19 nm Up, and they were 12 pcs and 19 pcs, respectively, indicating desirable LLS quality. Thereafter, a transportation test in which the rear face of the wafer stored in water was chucked and the wafer was unchucked onto the stage of the polishing machine was repeated 200 times, with the results that the wafer was successfully transported without any defects in all of 200 tests.

Comparative Examples A1 to A13

Wafers with bare faces obtained after DSP polishing were provided, and the following cleaning was performed in a batch-type cleaner. The chemical liquids used for the SC1 cleaning were ammonia water ($NH_4OH$) of 28% by mass and hydrogen peroxide water ($H_2O_2$) of 30% by mass. The first tank was used for the first cleaning step to perform ozone water cleaning (25 ppm, 25° C./3 min) aiming at oxide film formation, and the second tank was used for the second cleaning step to perform SC1 cleaning while varying the composition, the temperature, and the time as shown in Table 7 below aiming at roughening formation. Thereafter, Haze evaluation was performed by using a SP3 particle counter (manufactured by KLA). Further, at the same time, for each of the aqueous solutions used in the second tank, the etching amount of Si and the etching amount of $SiO_2$ were calculated from the difference in film thickness before and after the cleaning by the method described above, and the $Si/SiO_2$ selectivity ratio was calculated. To calculate the etching amount of Si, a silicon wafer with an exposed bare face without a native oxide film obtained after the HF cleaning was used, and the etching amount of Si was determined from the wafer thickness before and after the wafer cleaning using a flatness measuring apparatus. To calculate the etching amount of $SiO_2$, a wafer with a 5 nm oxide film formed by thermal oxidation was used, and the etching amount of $SiO_2$ was determined from the oxide film thickness before and after the cleaning using a spectroscopic ellipsometry.

As shown in Table 7, in Comparative Examples A1 to A13, the Haze values obtained by SP3 were all around 20 ppm, which is equivalent to that of a non-roughened wafer; accordingly, it was determined that roughening did not occur.

TABLE 7

| | 1st Tank | | 2nd Tank | | | | Total | Roughening | |
|---|---|---|---|---|---|---|---|---|---|
| | Chemical Liquid | Temperature/Time | Chemical Liquid | Temperature/Time | $Si/SiO_2$ Etching Selectivity Ratio | $SiO_2$ Etching Amount nm | $SiO_2$ Etching Amount nm | Evaluation Haze Unit: ppm | Determination |
| Comparative Example A1 | Ozone 25 ppm | 25° C./ 3 min | SC1 1:0.03:10 | 45° C./ 3 min | 16.9 | 0.24 | 0.24 | 20.3 | No Change |
| Comparative Example A2 | Ozone 25 ppm | 25° C./ 3 min | SC1 1:0.05:10 | 45° C./ 3 min | 6.8 | 0.24 | 0.24 | 19.8 | No Change |
| Comparative Example A3 | Ozone 25 ppm | 25° C./ 3 min | SC1 1:0.1:10 | 45° C./ 3 min | 1.6 | 0.24 | 0.24 | 18.9 | No Change |
| Comparative Example A4 | Ozone 25 ppm | 25° C./ 3 min | SC1 1:0.3:10 | 45° C./ 3 min | 0.4 | 0.24 | 0.24 | 21.2 | No Change |
| Comparative Example A5 | Ozone 25 ppm | 25° C./ 3 min | SC1 1:1:10 | 45° C./ 3 min | 4.9 | 1.2 | 1.20 | 21.3 | No Change |
| Comparative Example A6 | Ozone 25 ppm | 25° C./ 3 min | SC1 1:1:10 | 60° C./ 3 min | 4.4 | 1.7 | 1.70 | 20.8 | No Change |
| Comparative Example A7 | Ozone 25 ppm | 25° C./ 3 min | SC1 1:1:10 | 80° C./ 3 min | 2.4 | 3.3 | 3.30 | 19.5 | No Change |

TABLE 7-continued

| | 1st Tank | | 2nd Tank | | | | Total | Roughening | |
|---|---|---|---|---|---|---|---|---|---|
| | | Tem- | | Tem- | $Si/SiO_2$ | $SiO_2$ | $SiO_2$ | Evaluation | |
| | Chemical Liquid | perature/ Time | Chemical Liquid | perature/ Time | Etching Selectivity Ratio | Etching Amount nm | Etching Amount nm | Haze Unit: ppm | Determination |
| Comparative Example A8 | Ozone 25 ppm | 25° C./ 3 min | SC1 1:0.1:100 | 45° C./ 3 min | 14.4 | 0.2 | 0.18 | 18.5 | No Change |
| Comparative Example A9 | Ozone 25 ppm | 25° C./ 3 min | SC1 1:0.3:100 | 45° C./ 3 min | 5.6 | 0.2 | 0.18 | 19.9 | No Change |
| Comparative Example A10 | Ozone 25 ppm | 25° C./ 3 min | SC1 1:0.3:100 | 60° C./ 3 min | 22.2 | 0.2 | 0.22 | 21.3 | No Change |
| Comparative Example A11 | Ozone 25 ppm | 25° C./ 3 min | SC1 1:1:100 | 45° C./ 3 min | 7.9 | 0.2 | 0.18 | 22.5 | No Change |
| Comparative Example A12 | Ozone 25 ppm | 25° C./ 3 min | SC1 1:1:100 | 60° C./ 3 min | 9.5 | 0.2 | 0.22 | 18.7 | No Change |
| Comparative Example A13 | Ozone 25 ppm | 25° C./ 3 min | SC1 1:1:100 | 80° C./ 3 min | 6.5 | 0.8 | 0.76 | 19.7 | No Change |

After CMP polishing with a polishing allowance of 500 nm was performed with respect to the level of Comparative Example A1, a chuck test similar to that of Example A19 was conducted 200 times using a CMP polishing machine. In 4 out of 200 tests, a defect occurred in which the wafer was not released from the chuck.

The above results revealed that, in Examples A1 to 34 of the present invention, by using a chemical liquid having an etching selectivity ratio of Si to $SiO_2$ of 95 or more in the second cleaning step, the front and rear faces, in particular the rear face, of the silicon wafers were sufficiently roughened to exhibit a roughness suitable for suction by the chuck.

On the other hand, in Comparative Examples A1 to 13 in which a chemical liquid having an etching selectivity ratio of Si to $SiO_2$ of 95 or more was not used in the second cleaning step, the front and rear faces, in particular the rear face, of the silicon wafers were not sufficiently roughened to exhibit a roughness suitable for suction by the chuck.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method of cleaning a silicon wafer in which the silicon wafer is roughened, comprising:

a first cleaning step of forming an oxide film on the silicon wafer by SC1 cleaning, SC2 cleaning, or ozone water cleaning; and a second cleaning step of cleaning the silicon wafer on which the oxide film is formed by using any one of:

an aqueous solution containing ammonium hydroxide; or an aqueous solution containing ammonium hydroxide and hydrogen peroxide water, to roughen front and rear faces or a rear face of the silicon wafer, wherein the aqueous solution used in the second cleaning step has an etching selectivity ratio of Si to $SiO_2$ of 95 or more.

2. The method of cleaning a silicon wafer according to claim 1, wherein the etching selectivity ratio of Si to $SiO_2$ of the aqueous solution used in the second cleaning step is determined according to: (etching amount of Si/etching amount of $SiO_2$), any one of an epitaxial wafer, a SOI wafer, and a silicon wafer with an exposed bare face without a native oxide film, is used as a wafer for calculating the etching amount of Si, and a wafer with a silicon oxide film having a thickness of 3 nm or more is used as a wafer for calculating the etching amount of $SiO_2$.

3. The method of cleaning a silicon wafer according to claim 1, wherein the etching amount of $SiO_2$ required for advancing roughening in the second cleaning step is calculated as a roughening etching amount in advance for each method of forming the oxide film in the first cleaning step, the cleaning time in the second cleaning step is selected so that the etching amount of $SiO_2$ in the second cleaning step is equal to or more than the roughening etching amount, and/or an additional cleaning step in which the thickness of the oxide film is reduced so that a portion of the oxide film formed in the first cleaning step remains is added before the second cleaning step, and cleaning time is adjusted so that the sum of the etching amount of $SiO_2$ in the additional cleaning step and the etching amount of $SiO_2$ in the second cleaning step is equal to or more than the roughening etching amount.

4. The method of cleaning a silicon wafer according to claim 1, wherein a relationship among an etching selectivity ratio of Si to $SiO_2$ and cleaning time and a surface roughness is determined in advance for each method of forming the oxide film in the first cleaning step, and the etching selectivity ratio of Si to $SiO_2$ and the cleaning time are selected based on the determined relationship and the second cleaning step is performed.

5. A method of manufacturing a silicon wafer, comprising performing CMP polishing on one side of a silicon wafer, which is cleaned by the method of cleaning a silicon wafer according to claim 1 to have roughened front and rear faces, to obtain a silicon wafer in which only a side opposite to the one side is selectively roughened.

6. A method of manufacturing a silicon wafer, comprising performing CMP polishing on one side of a silicon wafer, which is cleaned by the method of cleaning a silicon wafer according to claim 2 to have roughened front and rear faces, to obtain a silicon wafer in which only a side opposite to the one side is selectively roughened.

7. A method of manufacturing a silicon wafer, comprising performing CMP polishing on one side of a silicon wafer, which is cleaned by the method of cleaning a silicon wafer according to claim 3 to have roughened front and rear faces, to obtain a silicon wafer in which only a side opposite to the one side is selectively roughened.

8. A method of manufacturing a silicon wafer, comprising performing CMP polishing on one side of a silicon wafer, which is cleaned by the method of cleaning a silicon wafer according to claim 4 to have roughened front and rear faces, to obtain a silicon wafer in which only a side opposite to the one side is selectively roughened.

9. The method of manufacturing a silicon wafer according to claim 5, wherein a removal allowance of the CMP polishing is set to be equal to or greater than the etching amount of Si in the second cleaning step.

10. The method of manufacturing a silicon wafer according to claim 6, wherein a removal allowance of the CMP polishing is set to be equal to or greater than the etching amount of Si in the second cleaning step.

11. The method of manufacturing a silicon wafer according to claim 7, wherein a removal allowance of the CMP polishing is set to be equal to or greater than the etching amount of Si in the second cleaning step.

12. The method of manufacturing a silicon wafer according to claim 8, wherein a removal allowance of the CMP polishing is set to be equal to or greater than the etching amount of Si in the second cleaning step.

13. The method of manufacturing a silicon wafer according to claim 5, wherein the etching amount of Si in the second cleaning step is set to be equal to or smaller than the removal allowance of the CMP polishing.

* * * * *